(12) United States Patent
Matsumoto et al.

(10) Patent No.: US 12,484,329 B2
(45) Date of Patent: Nov. 25, 2025

(54) SEMICONDUCTOR ELEMENT AND ELECTRONIC APPARATUS

(71) Applicant: SONY SEMICONDUCTOR SOLUTIONS CORPORATION, Kanagawa (JP)

(72) Inventors: Ryosuke Matsumoto, Kanagawa (JP); Shuji Manda, Kanagawa (JP); Shunsuke Maruyama, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 797 days.

(21) Appl. No.: 17/781,908

(22) PCT Filed: Nov. 27, 2020

(86) PCT No.: PCT/JP2020/044311
§ 371 (c)(1),
(2) Date: Jun. 2, 2022

(87) PCT Pub. No.: WO2021/112013
PCT Pub. Date: Jun. 10, 2021

(65) Prior Publication Data
US 2023/0022127 A1  Jan. 26, 2023

(30) Foreign Application Priority Data
Dec. 4, 2019  (JP) .................. 2019-219712

(51) Int. Cl.
*H10F 39/00*  (2025.01)
*H01L 23/00*  (2006.01)
(52) U.S. Cl.
CPC .......... *H10F 39/809* (2025.01); *H01L 24/08* (2013.01); *H01L 24/80* (2013.01); *H10F 39/018* (2025.01);
(Continued)

(58) Field of Classification Search
CPC ....... H10F 39/809; H10F 39/18; H01L 24/08; H01L 24/80; H01L 2224/08145; H01L 2224/80895; H01L 2224/80896
(Continued)

(56) References Cited

U.S. PATENT DOCUMENTS

| 2014/0117486 A1* | 5/2014 | Doi .................. H10F 39/191 |
| | | 257/448 |
| 2016/0043144 A1* | 2/2016 | Sato .................. H10K 30/82 |
| | | 257/40 |

(Continued)

FOREIGN PATENT DOCUMENTS

| WO | WO-2016129406 A1 | 8/2016 |
| WO | WO-2017122537 A1 | 7/2017 |

(Continued)

OTHER PUBLICATIONS

International Search Report from corresponding PCT application PCT/JP2020/044311, dated Feb. 2, 2021.

*Primary Examiner* — Igwe U Anya
(74) *Attorney, Agent, or Firm* — K&L Gates LLP

(57) ABSTRACT

There is provided a light-detecting device. A light-detecting device includes a first substrate including a first electrode, a semiconductor layer, a first insulating film, and a via, and a second substrate that faces the first substrate and is electrically connected to the semiconductor layer through the via. The semiconductor layer includes a compound semiconductor material. The first electrode includes a first portion and the second portion. The first portion of the first electrode is in contact with the semiconductor layer, and the second portion is in contact with both the first insulating film and the via.

18 Claims, 28 Drawing Sheets

(52) U.S. Cl.
CPC ............... *H01L 2224/08145* (2013.01); *H01L 2224/80895* (2013.01); *H01L 2224/80896* (2013.01)

(58) Field of Classification Search
USPC ......................................................... 257/444
See application file for complete search history.

(56) References Cited

U.S. PATENT DOCUMENTS

| | | | | |
|---|---|---|---|---|
| 2018/0350862 | A1* | 12/2018 | Nakajun | ............. H10F 39/8023 |
| 2019/0319055 | A1* | 10/2019 | Zaizen | .................. H10F 39/807 |
| 2020/0321386 | A1* | 10/2020 | Manda | ................... H10F 39/024 |
| 2023/0022127 | A1* | 1/2023 | Matsumoto | ............. H01L 24/08 |

FOREIGN PATENT DOCUMENTS

| | | |
|---|---|---|
| WO | WO-2017122538 A1 | 7/2017 |
| WO | 2018088083 A1 | 5/2018 |
| WO | WO-2018193747 A1 | 10/2018 |
| WO | 2018194030 A1 | 7/2019 |
| WO | 2019131134 A1 | 7/2019 |
| WO | WO-2019146299 A1 | 8/2019 |
| WO | WO-2019211968 A1 | 11/2019 |

* cited by examiner

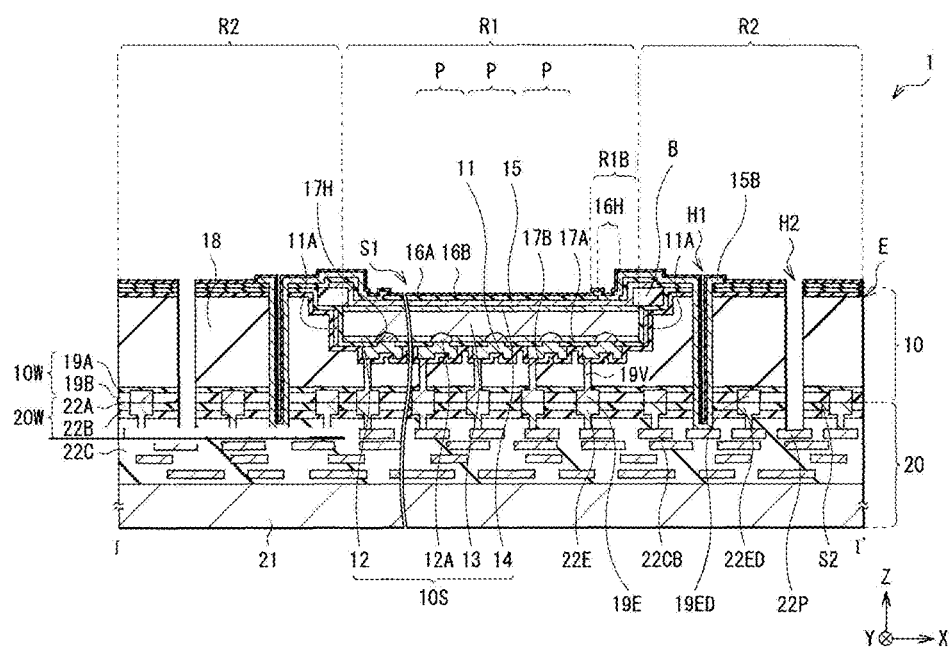
[Fig. 1]

[Fig. 2]
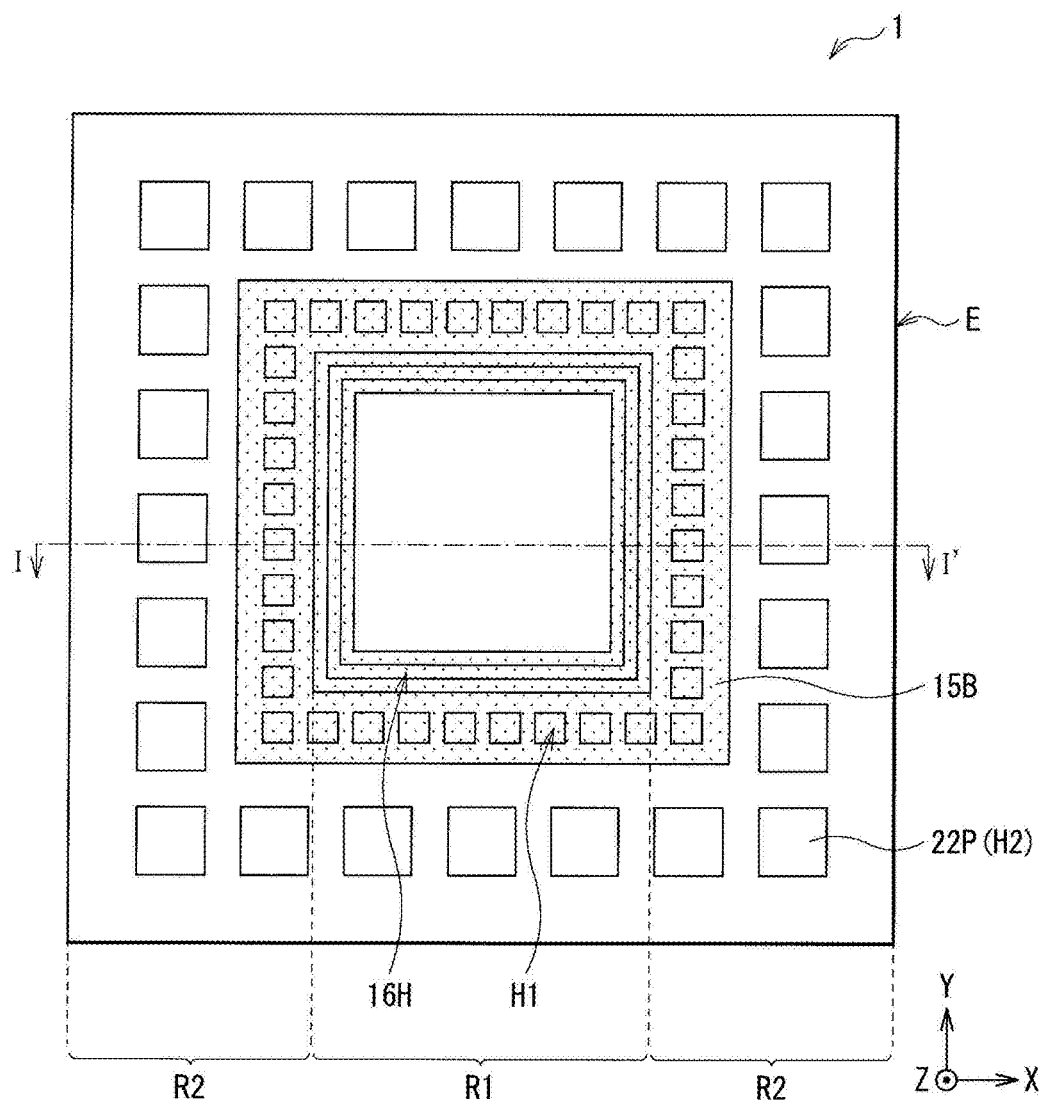

[Fig. 3A]
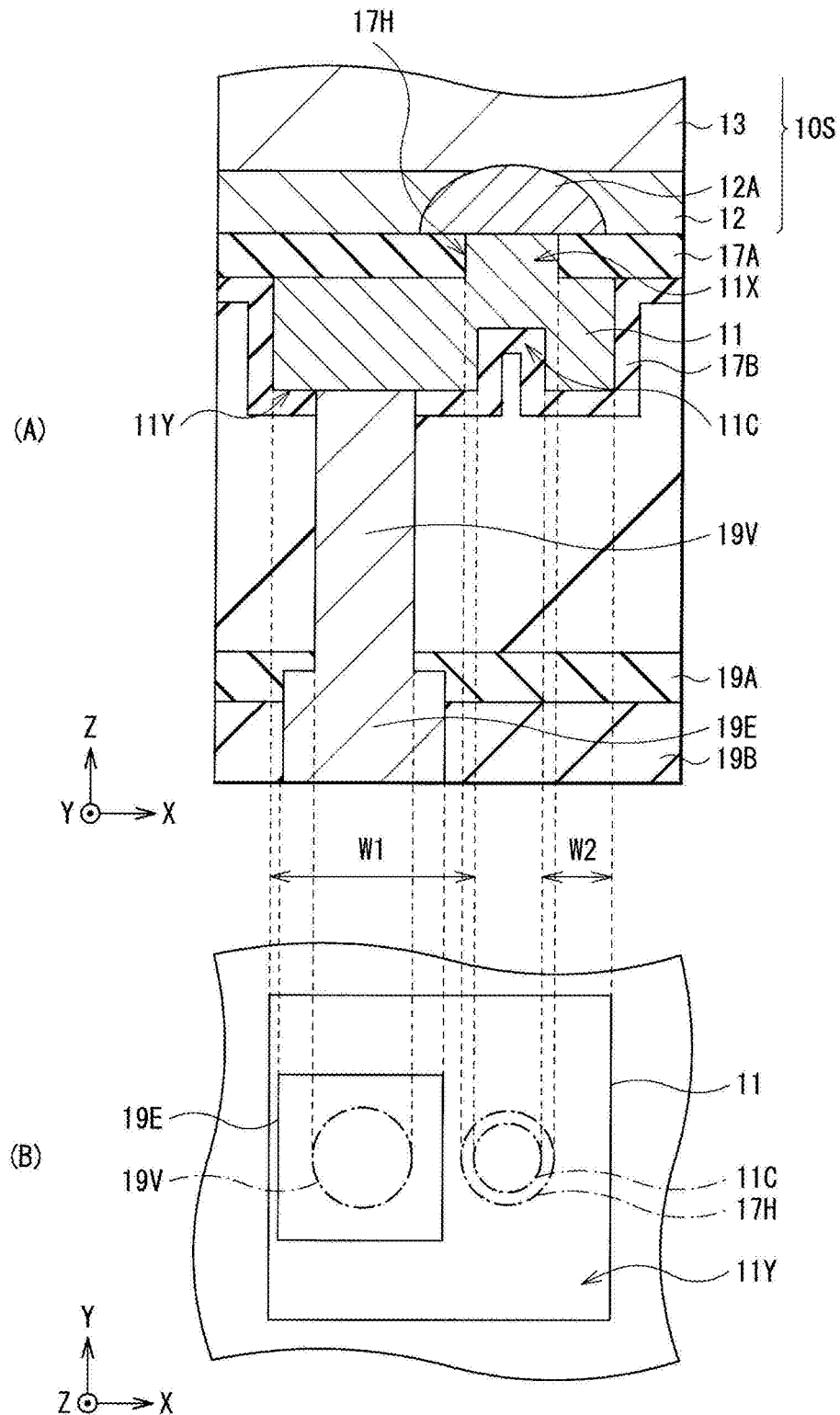

[Fig. 3B]
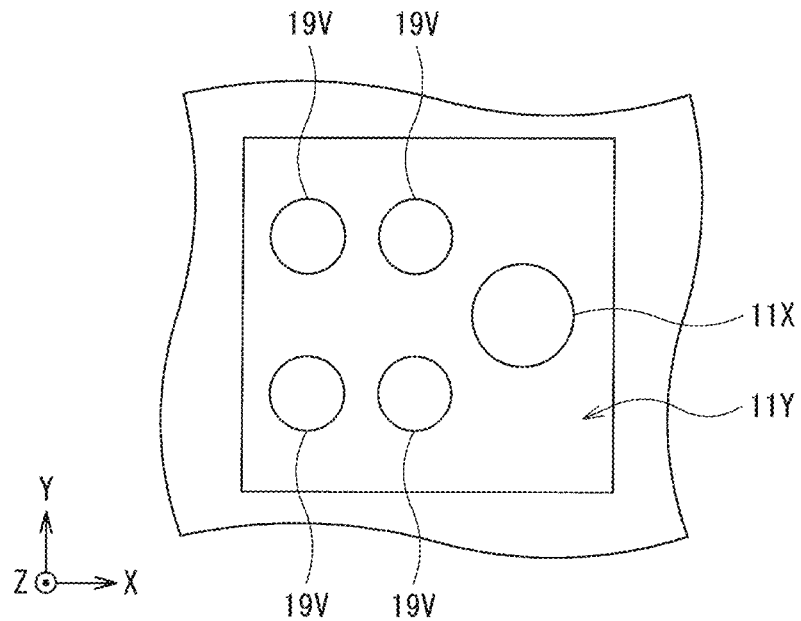
[Fig. 3C]
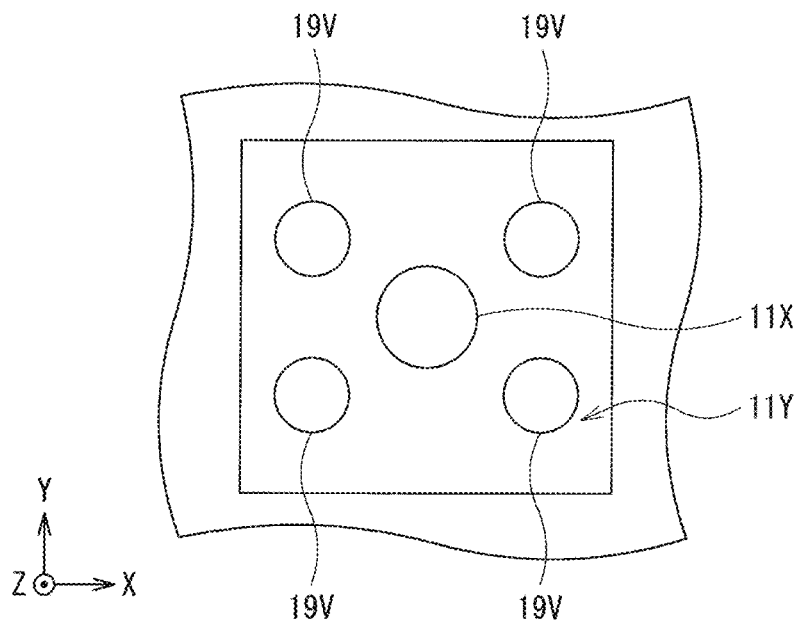

[Fig. 3D]
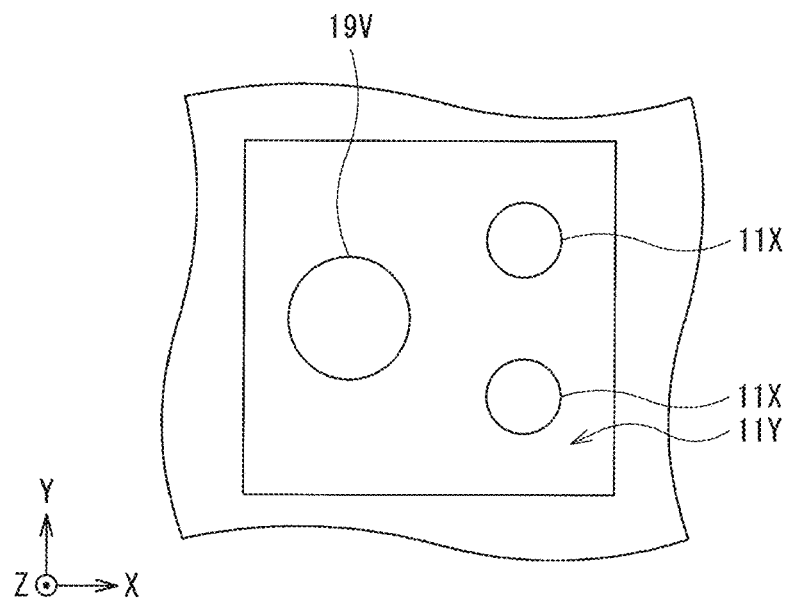
[Fig. 3E]
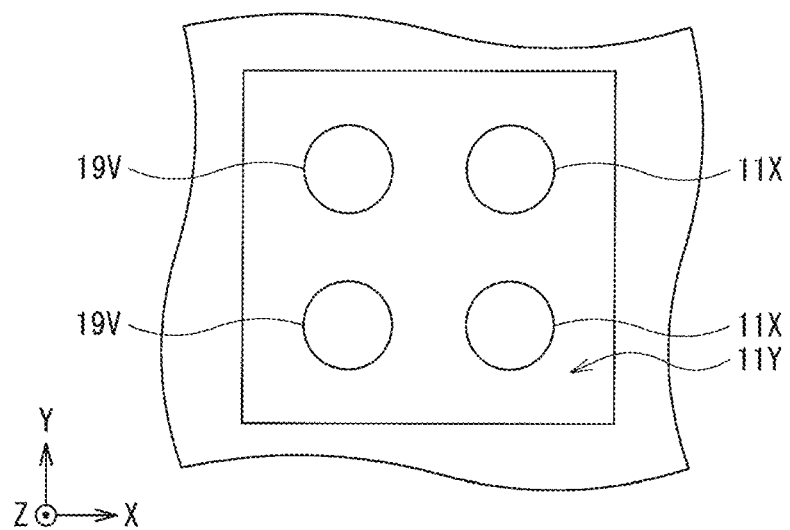

[Fig. 4]
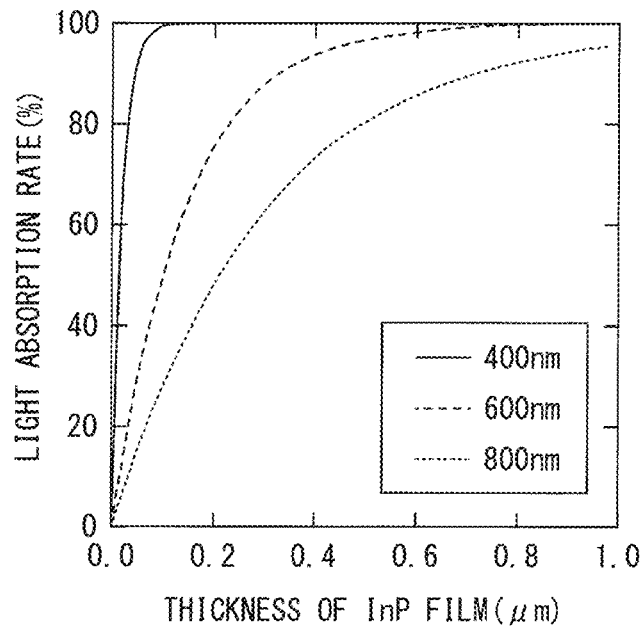
[Fig. 5]
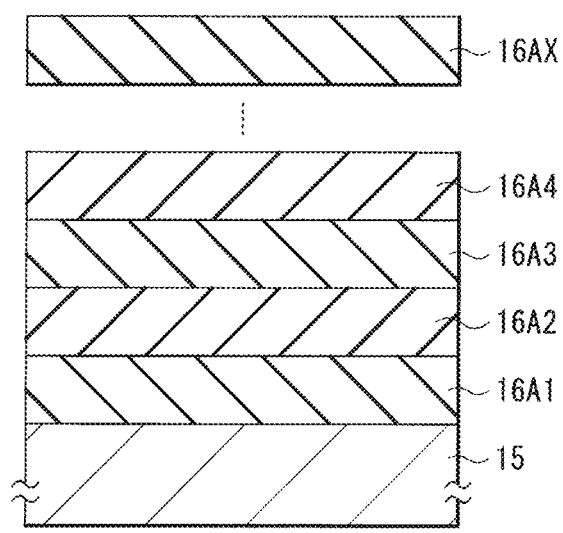

[Fig. 6A]
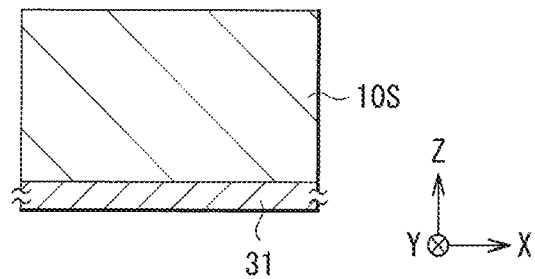
[Fig. 6B]
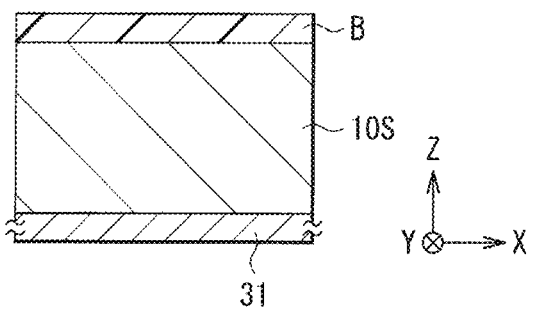
[Fig. 6C]
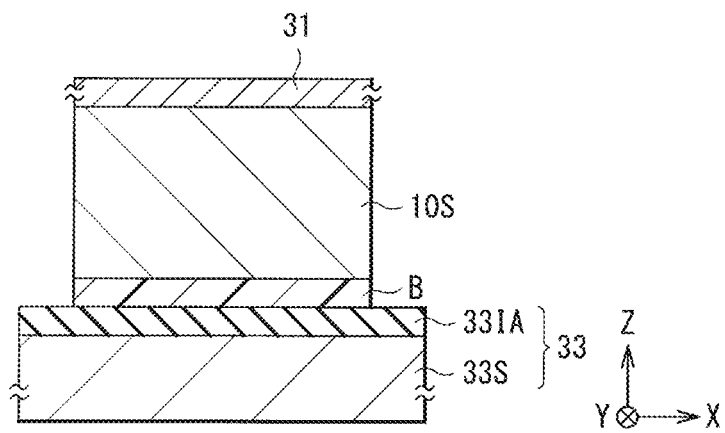

[Fig. 7]
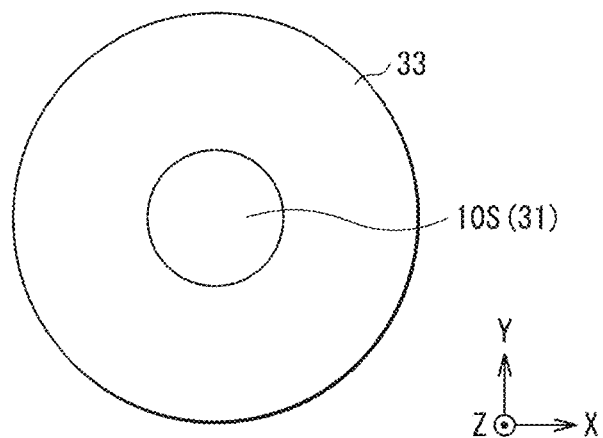
[Fig. 8]
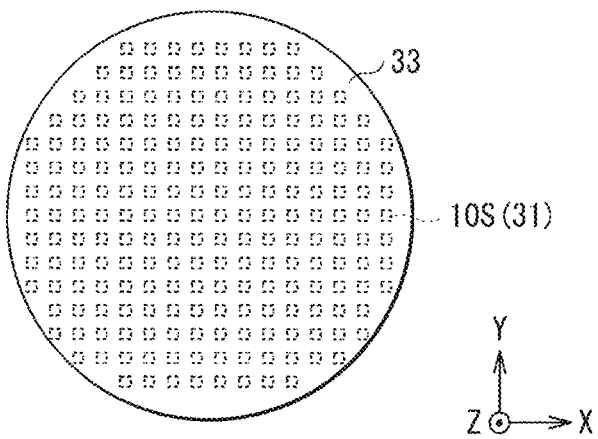

[Fig. 9A]
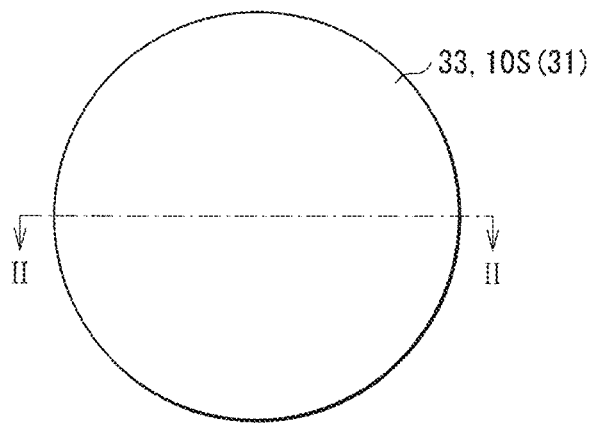
[Fig. 9B]
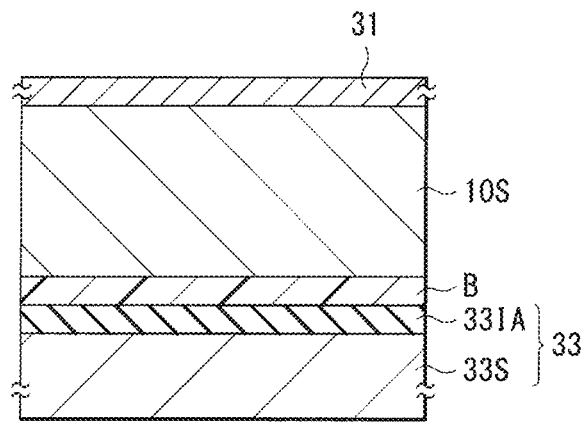
[Fig. 10A]
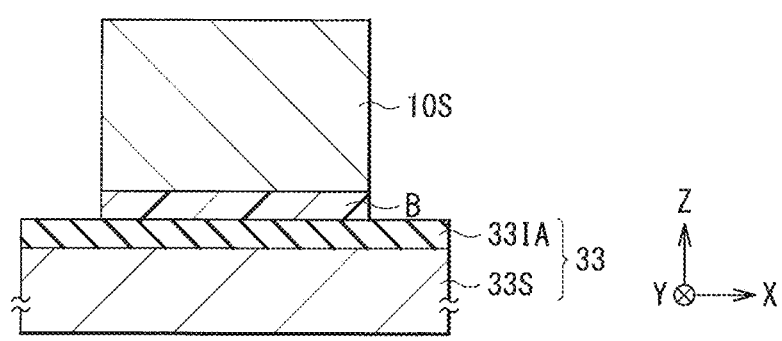

[Fig. 10B]
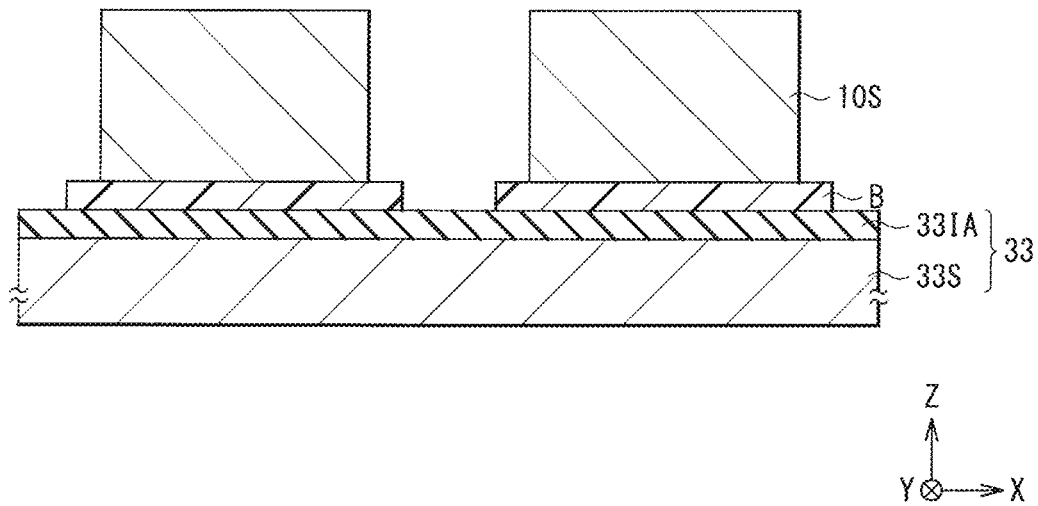
[Fig. 11A]
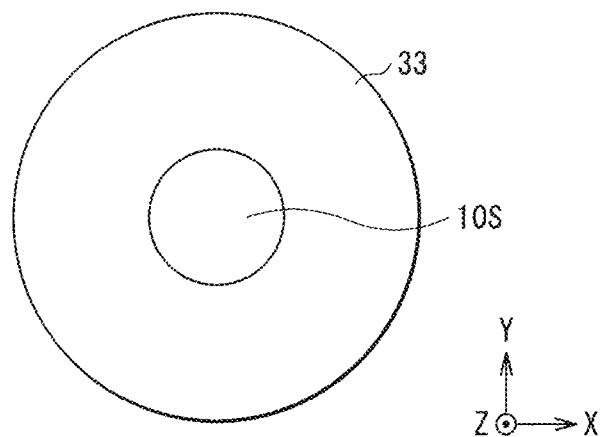
[Fig. 11B]
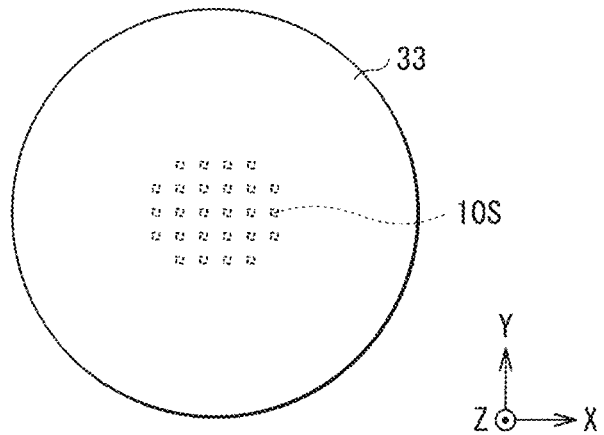

[Fig. 12A]
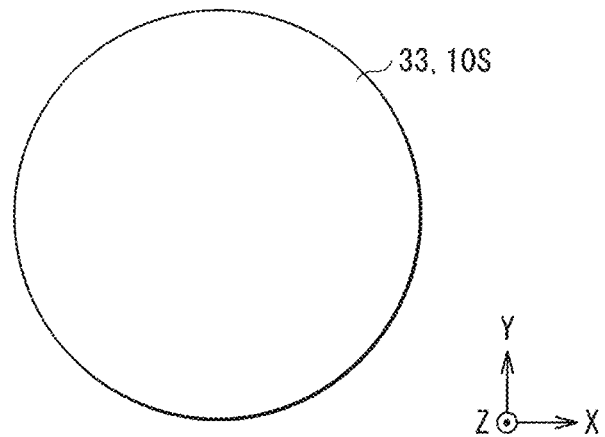
[Fig. 12B]
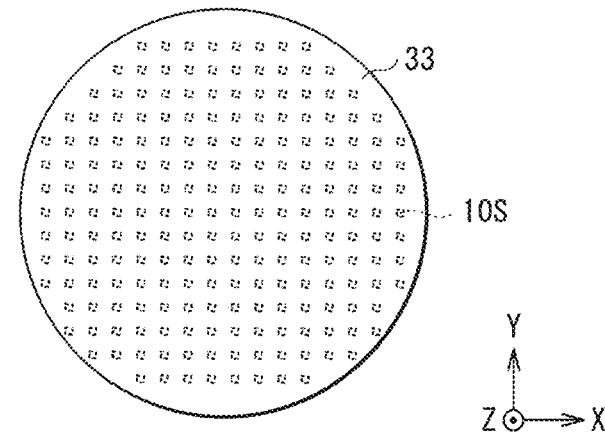
[Fig. 13A]
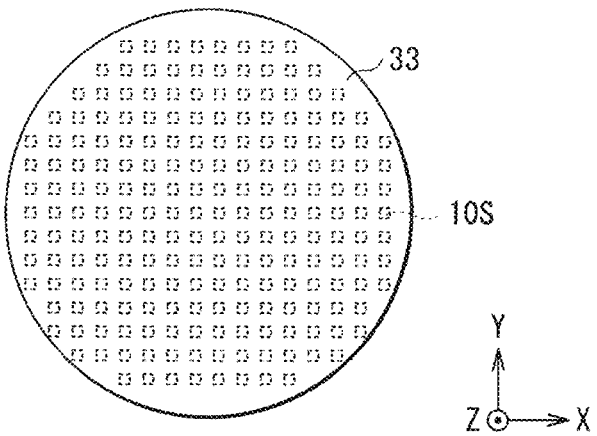

[Fig. 13B]
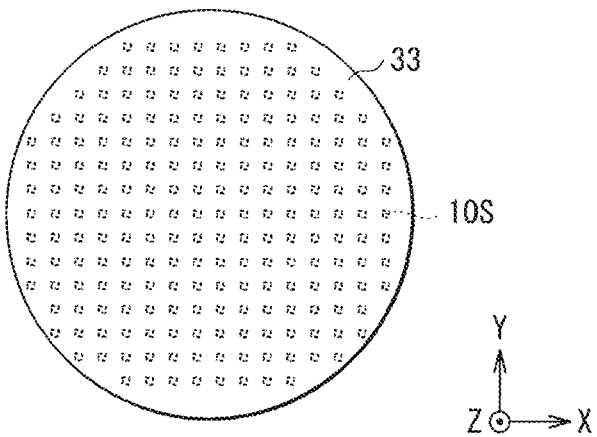
[Fig. 14]
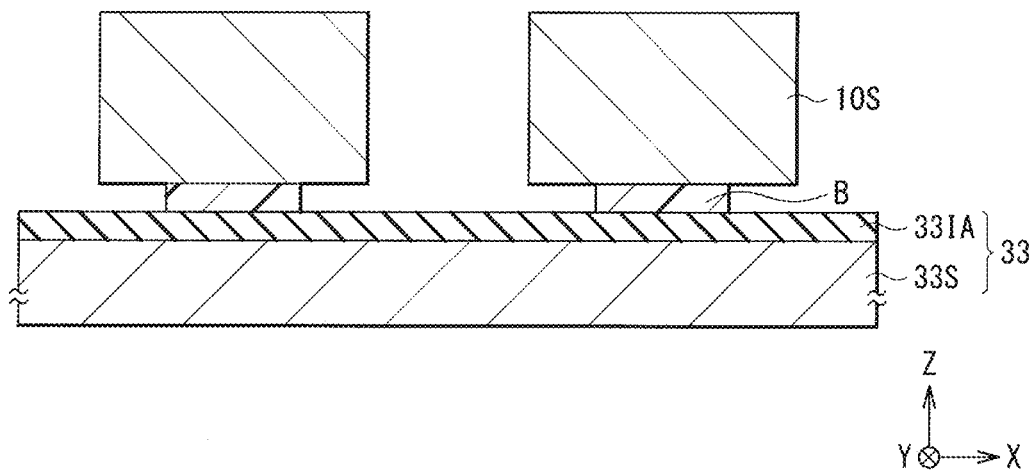
[Fig. 15]
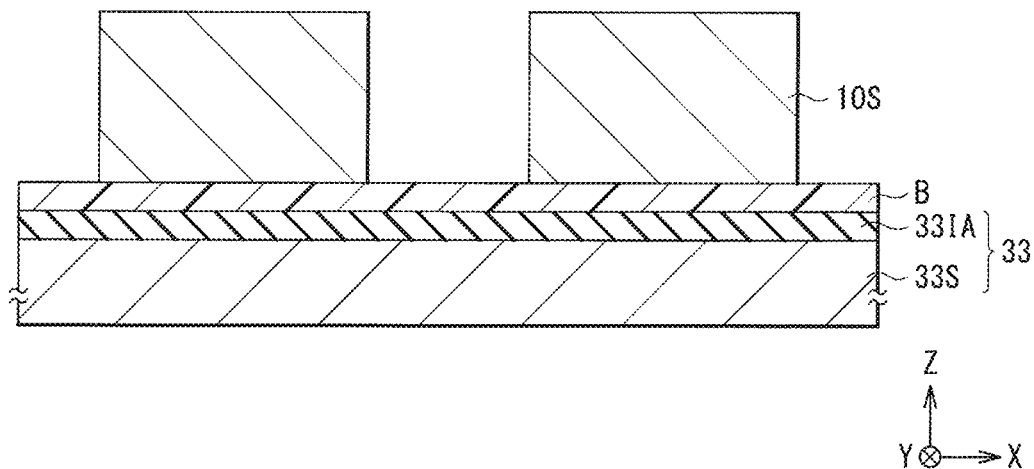

[Fig. 16A]
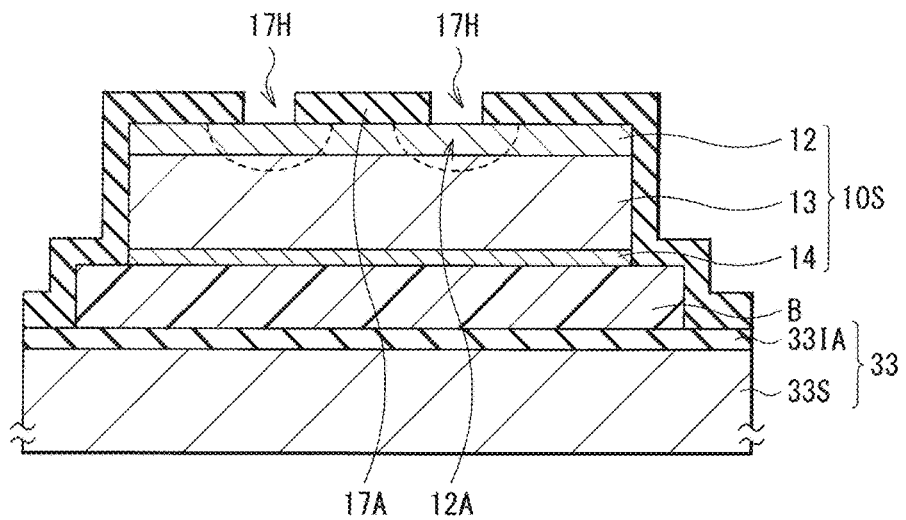
[Fig. 16B]
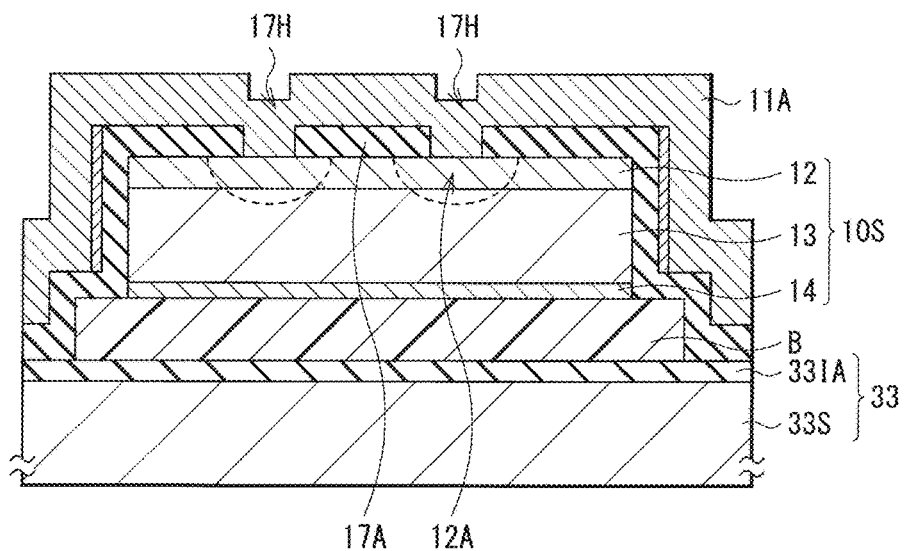
[Fig. 16C]
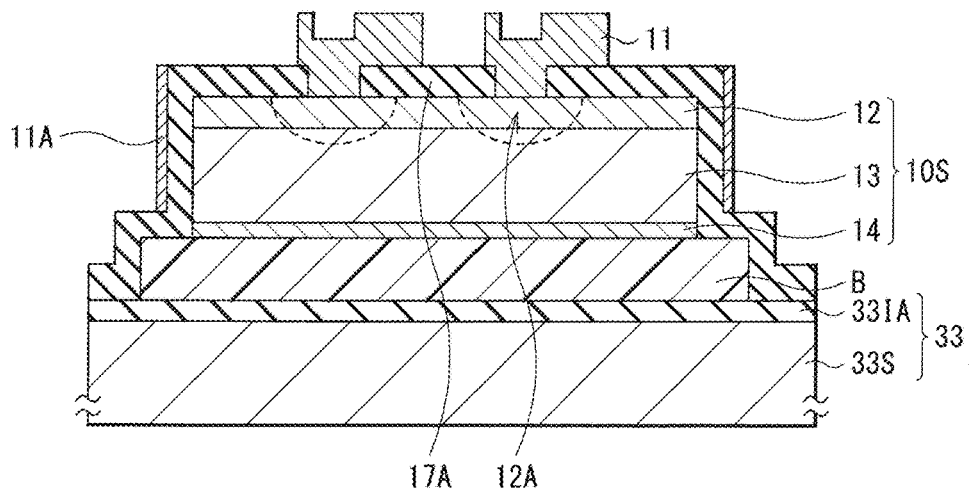

[Fig. 16D]
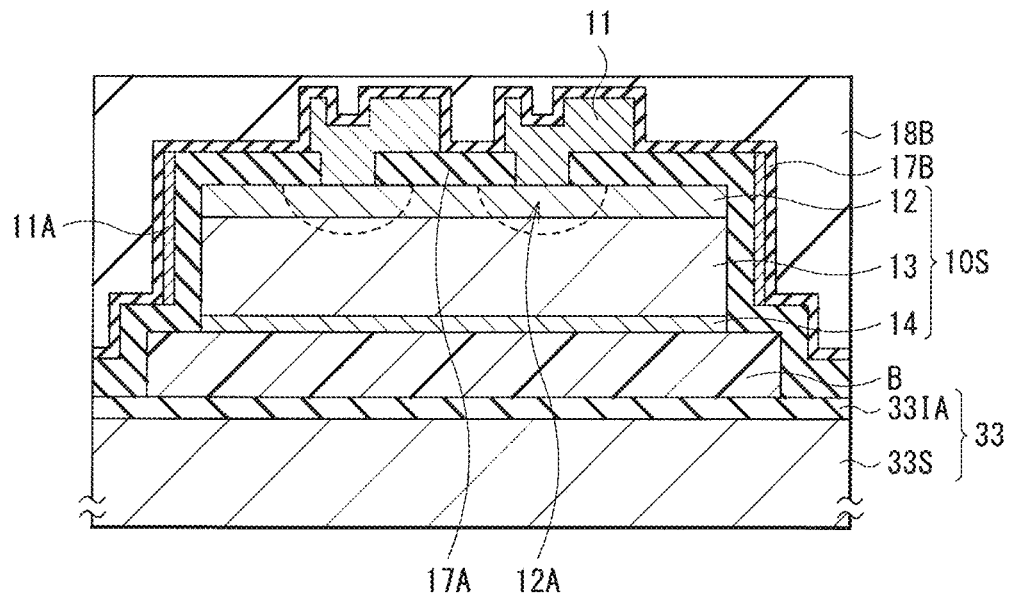
[Fig. 16E]
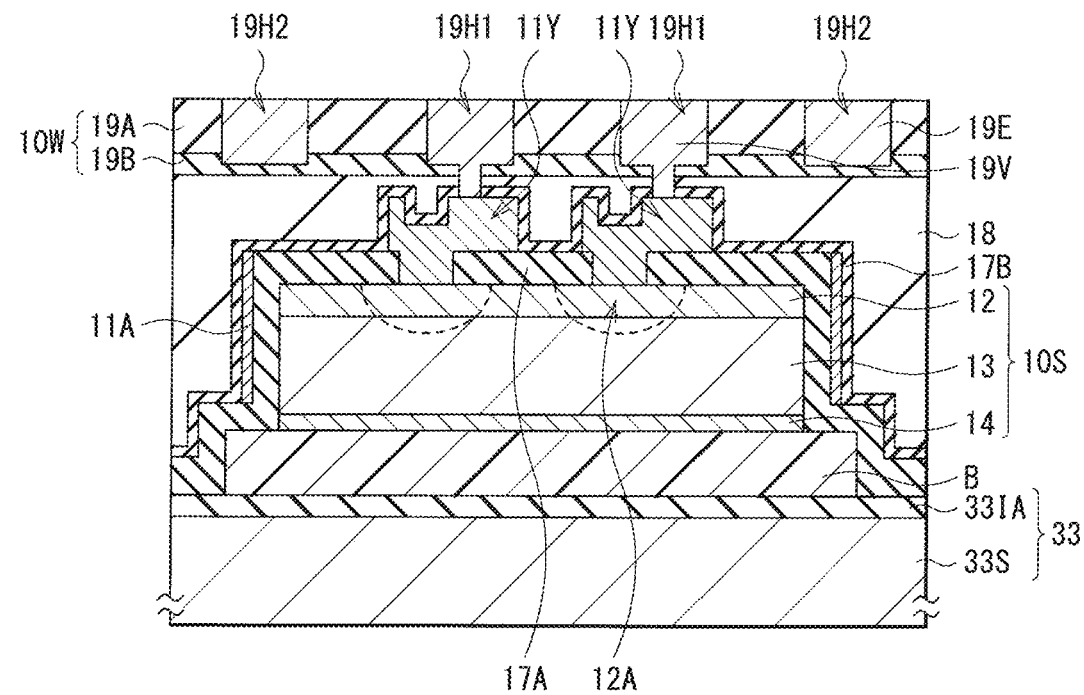

[Fig. 16F]
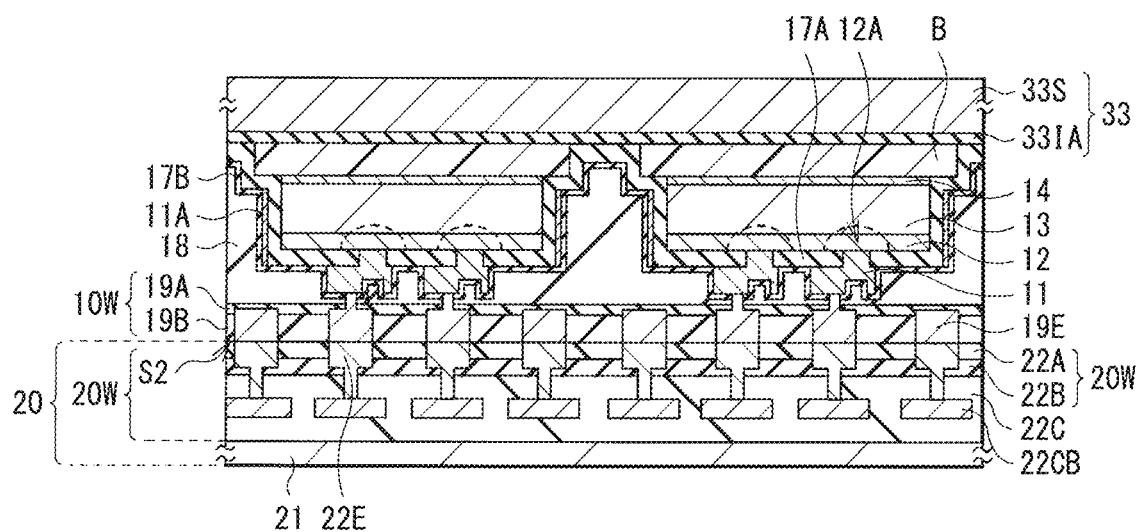
[Fig. 16G]
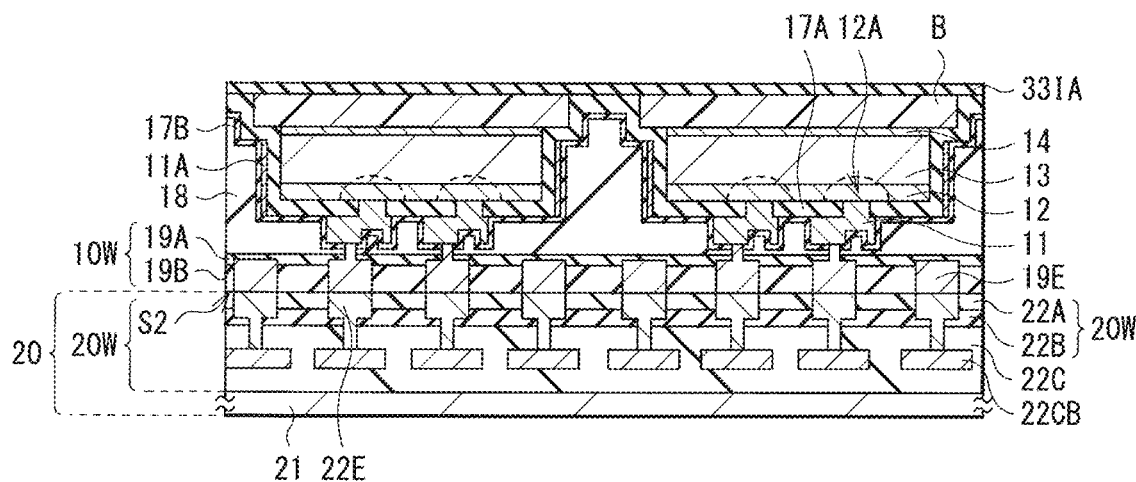

[Fig. 16H]
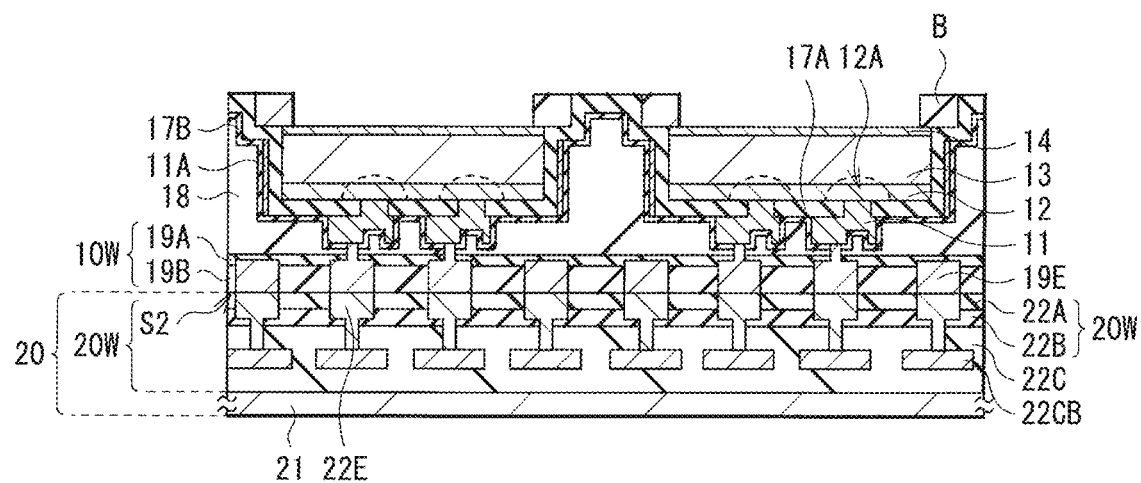
[Fig. 16I]
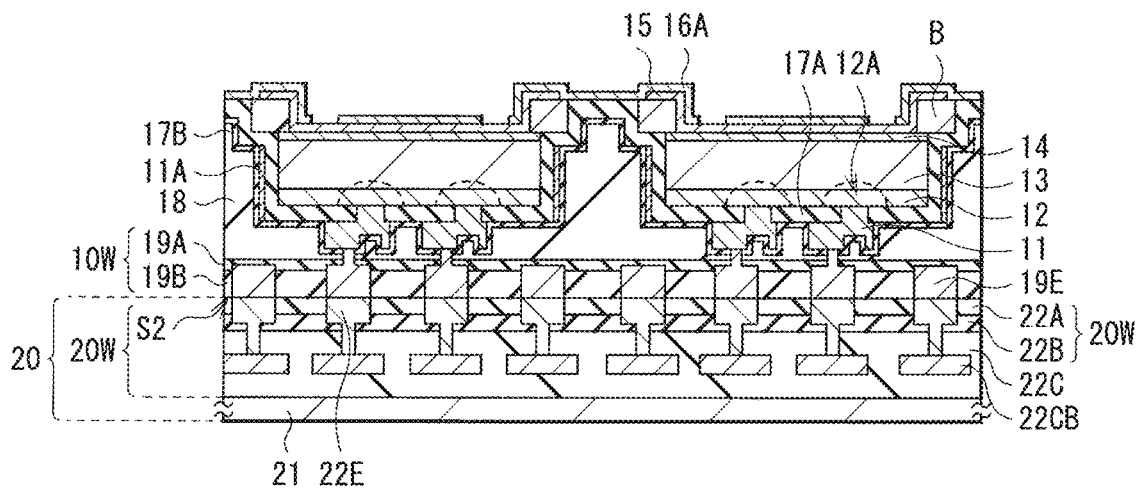

[Fig. 16J]
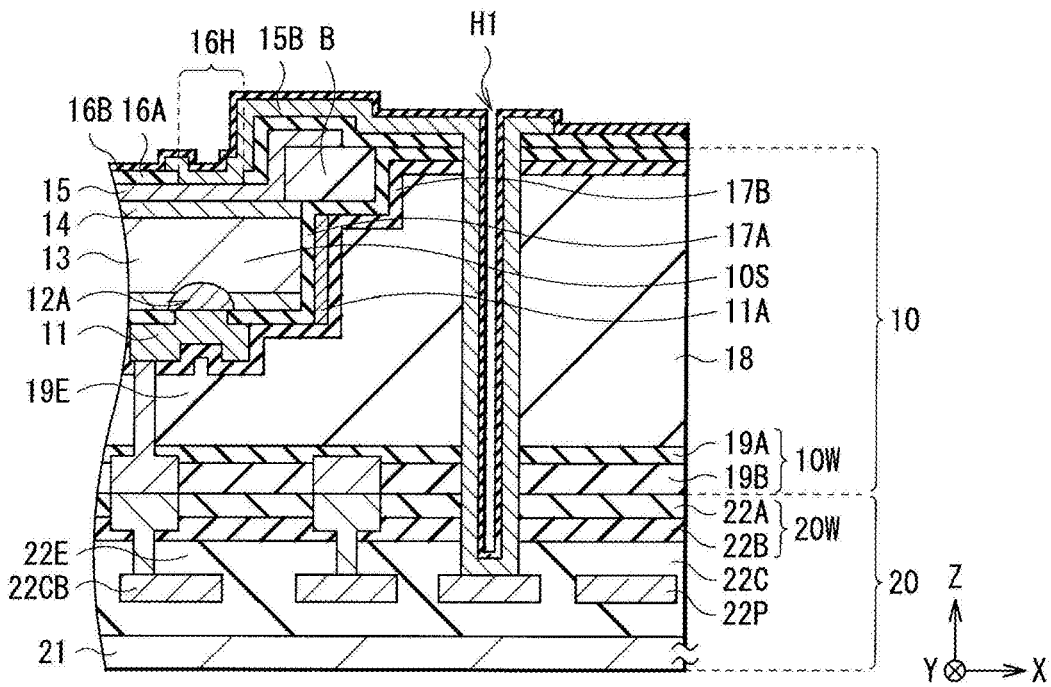
[Fig. 16K]
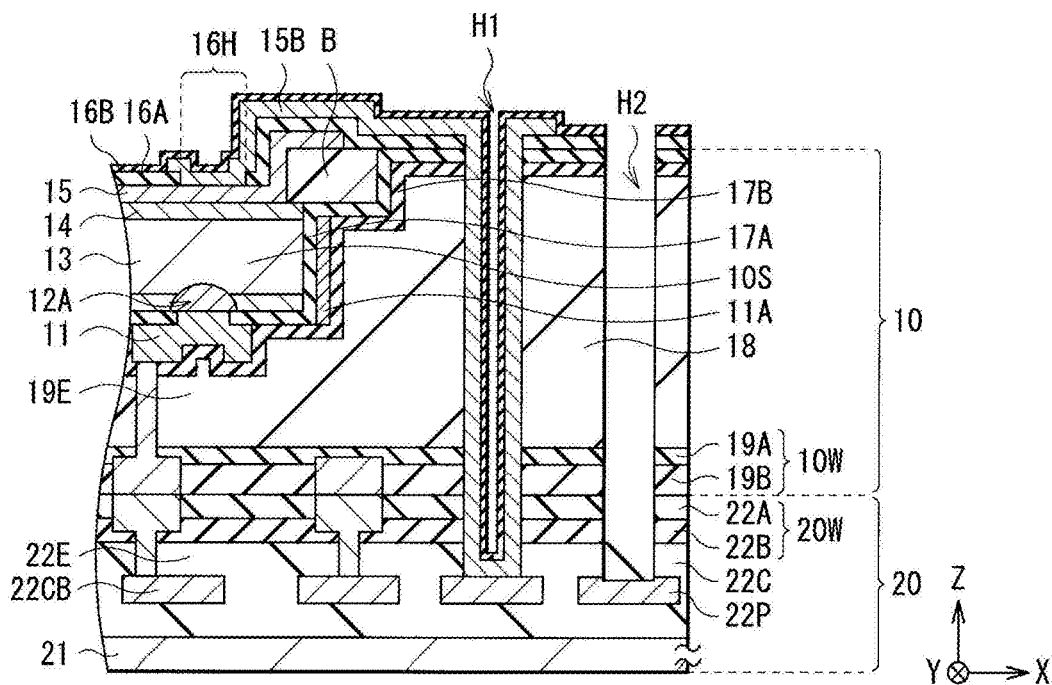

[Fig. 17A]
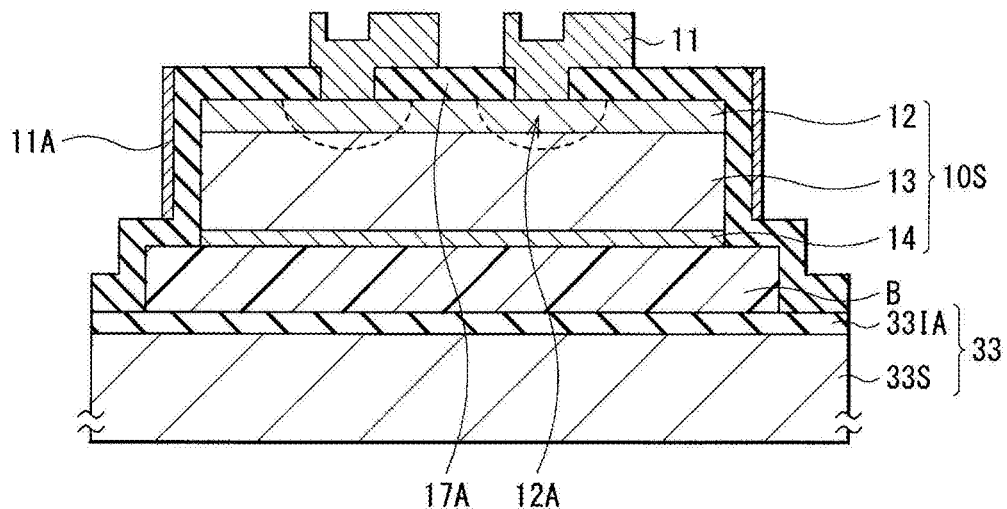
[Fig. 17B]
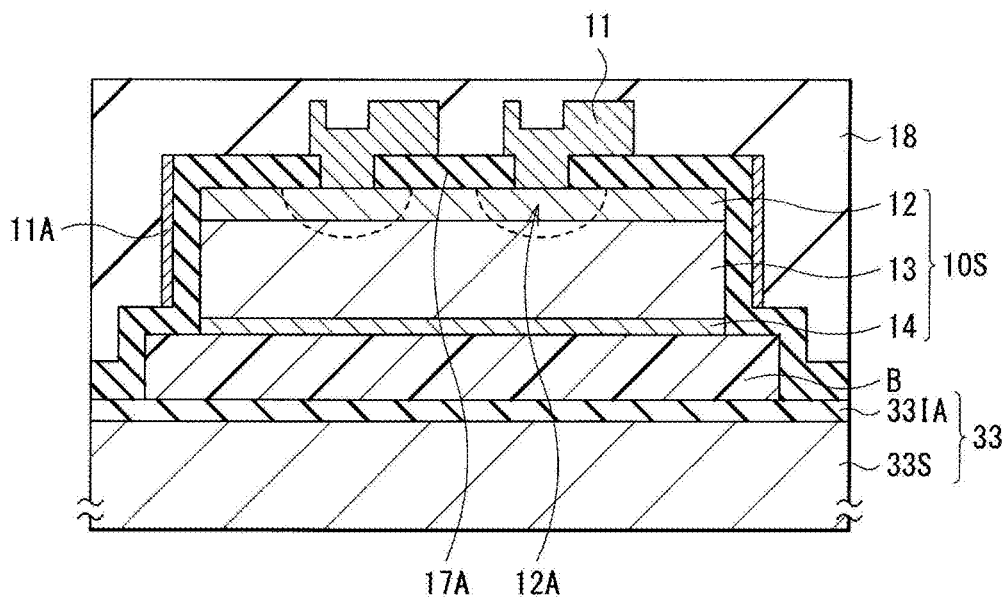

[Fig. 18A]
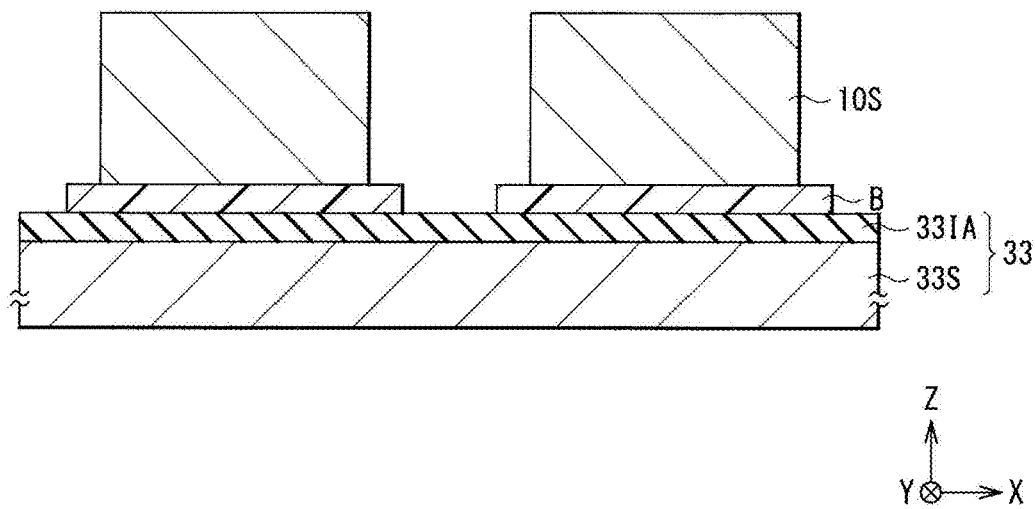
[Fig. 18B]
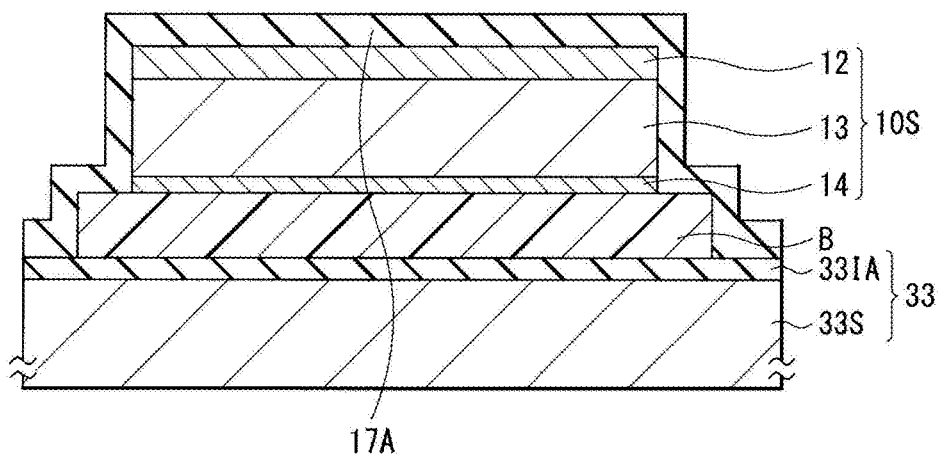
[Fig. 18C]
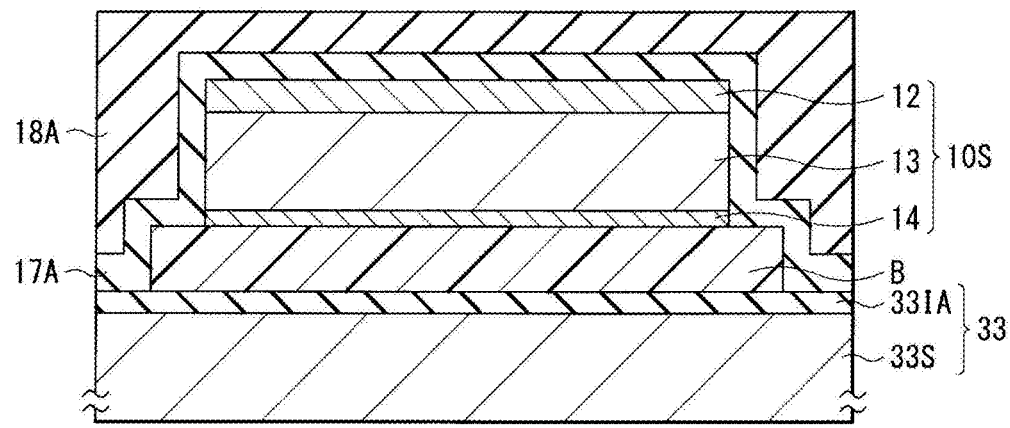

[Fig. 18D]
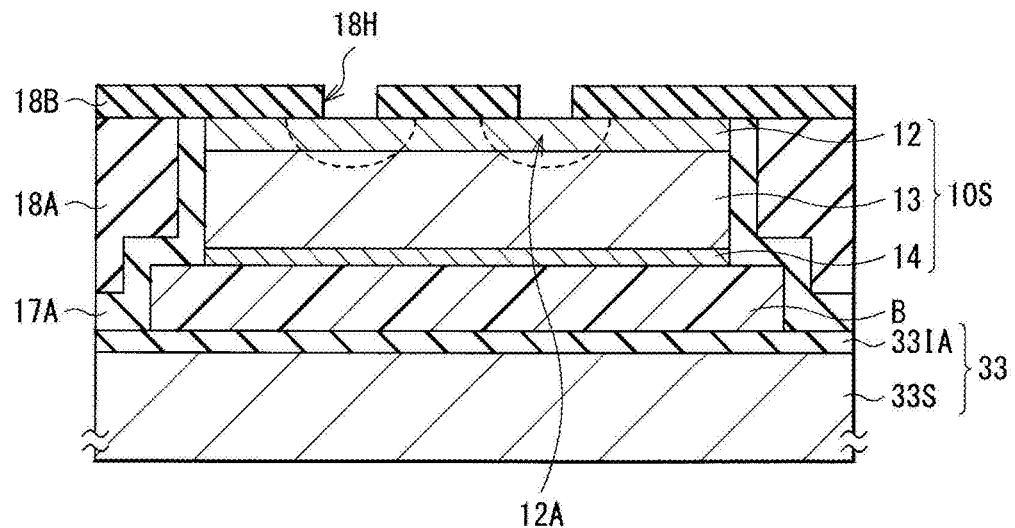
[Fig. 18E]
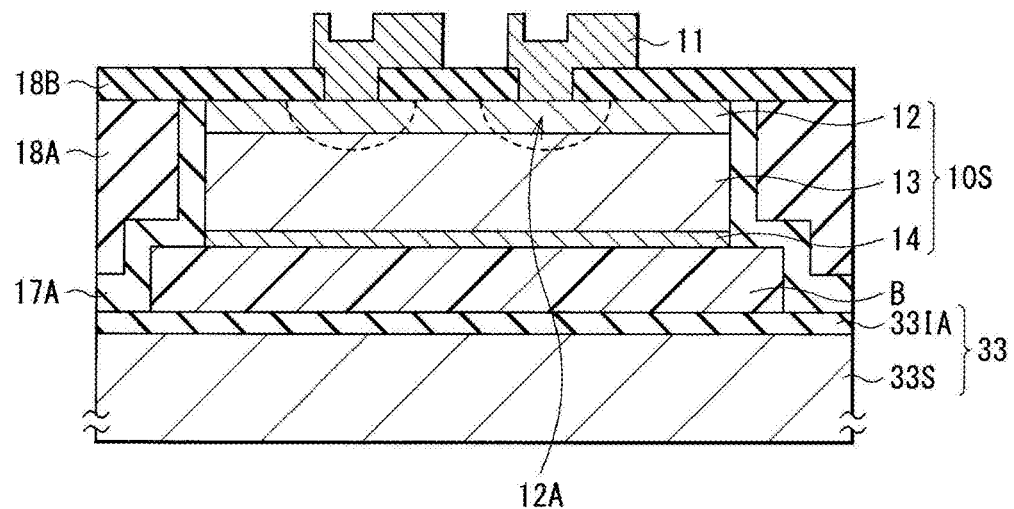

[Fig. 18F]
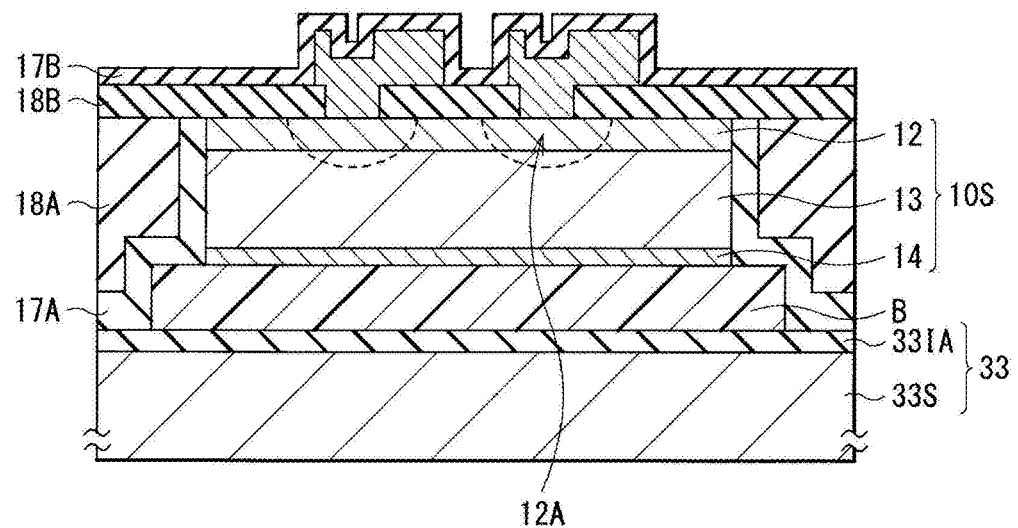

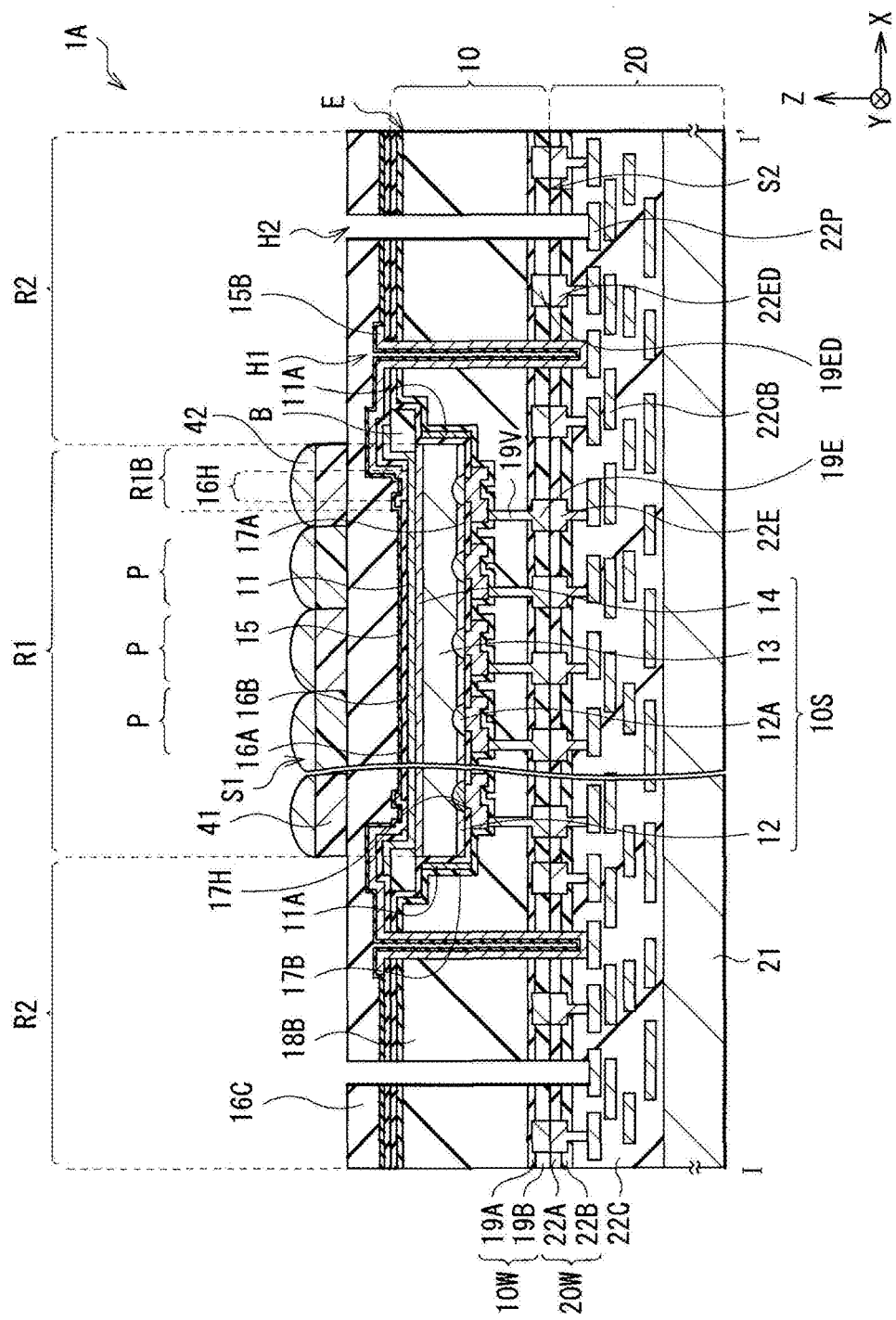
[Fig. 19]

[Fig. 20]
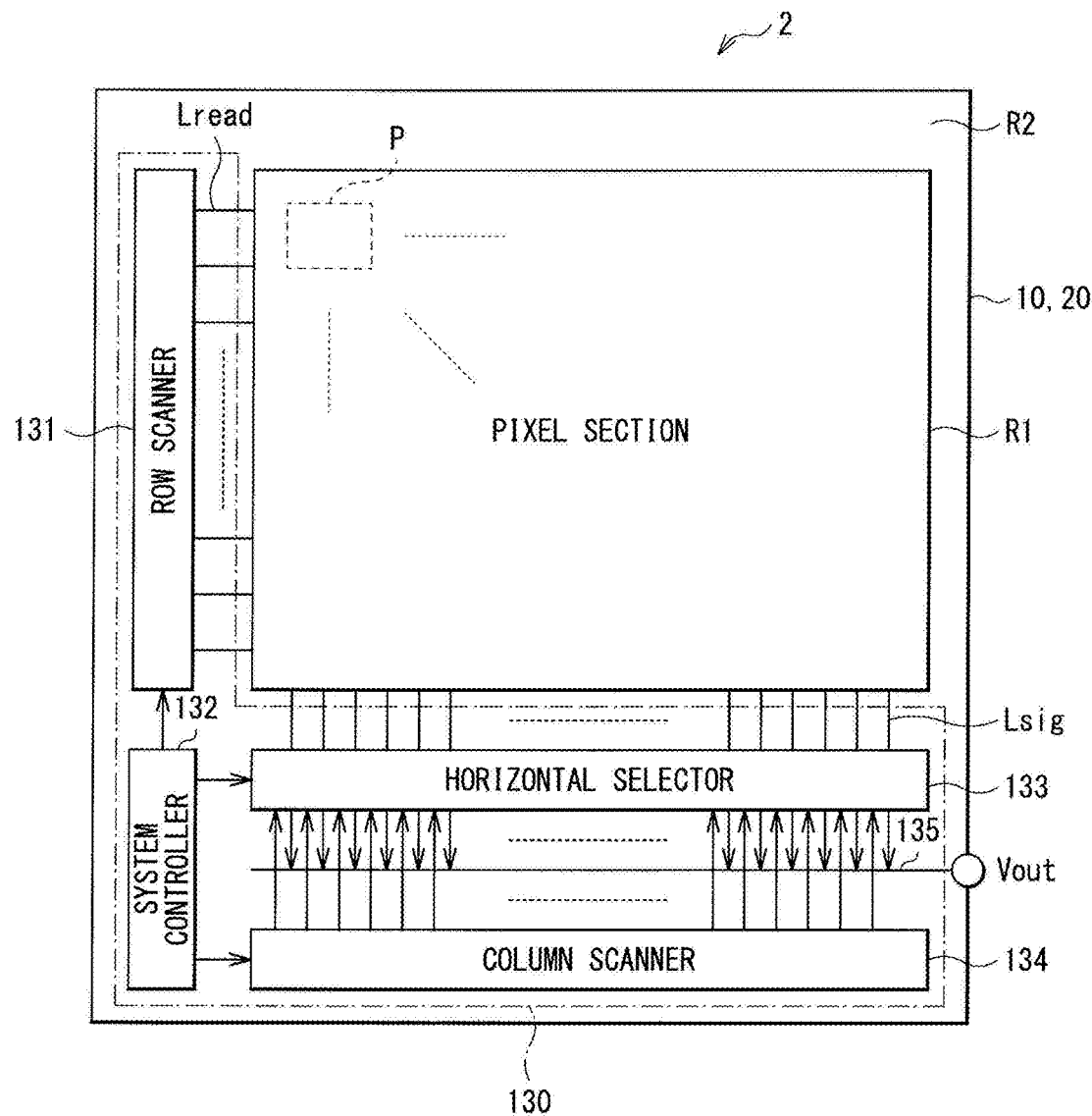
[Fig. 21]
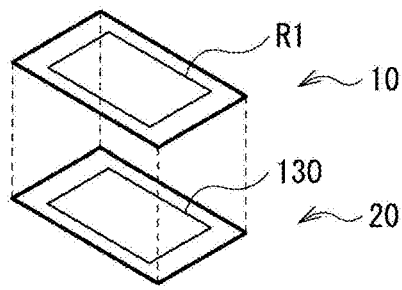

[Fig. 22]
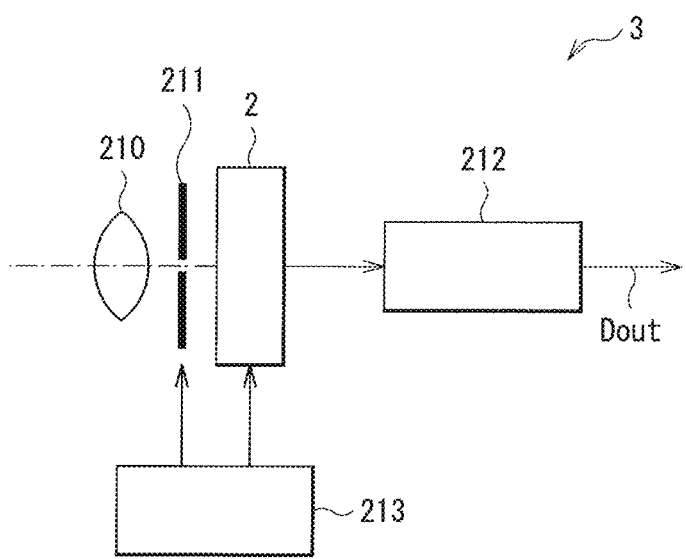

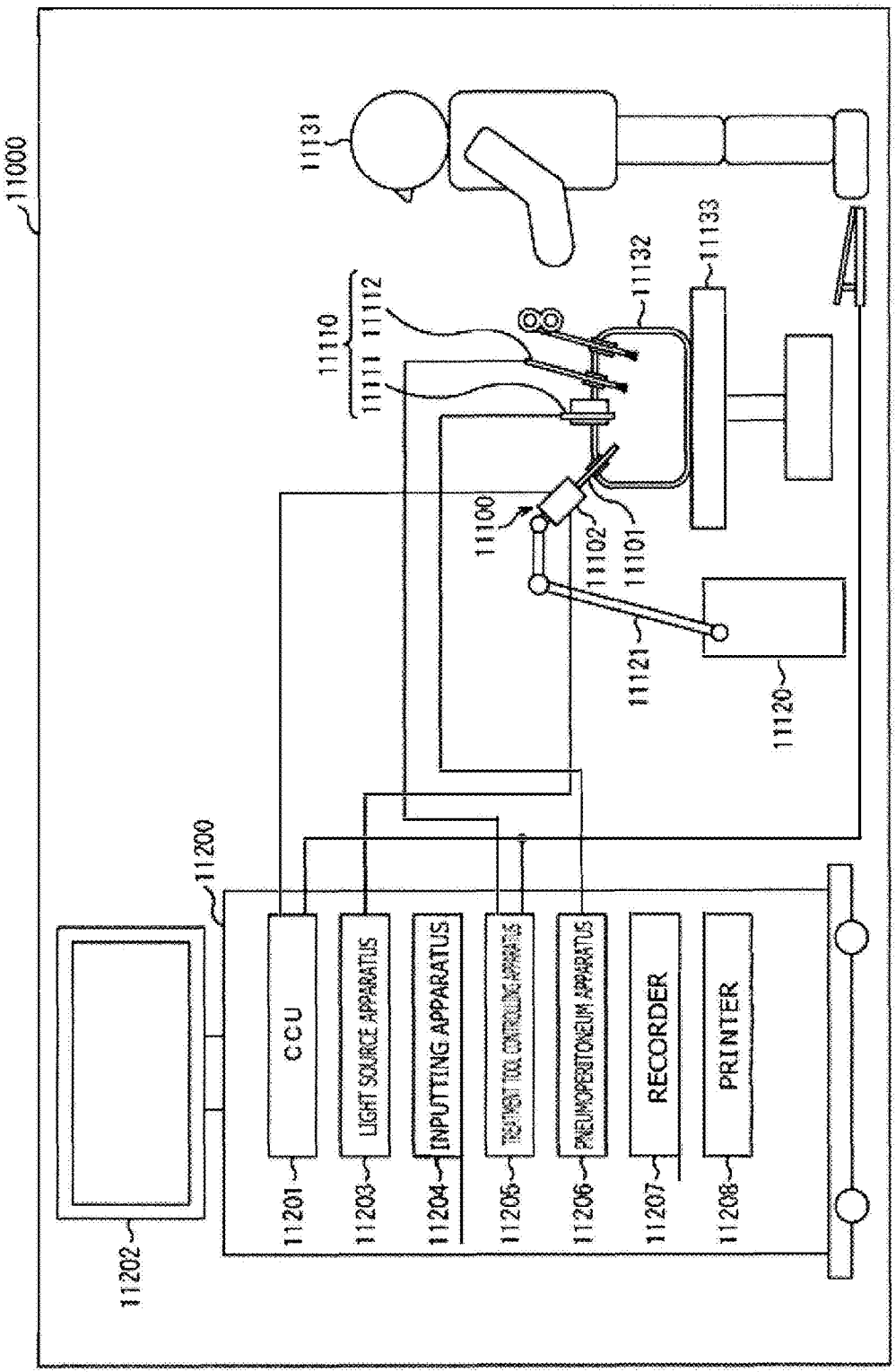
[Fig. 23]

[Fig. 24]
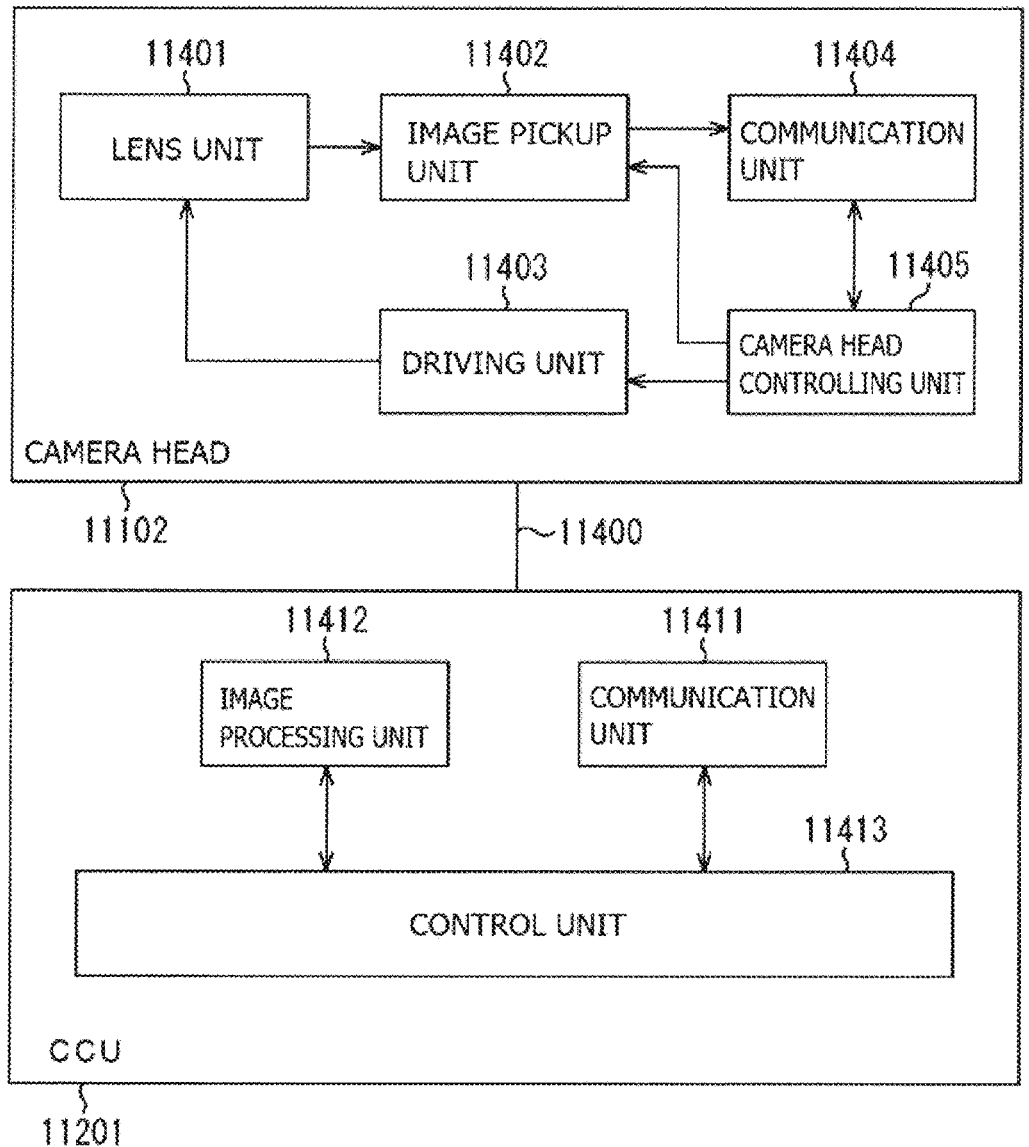

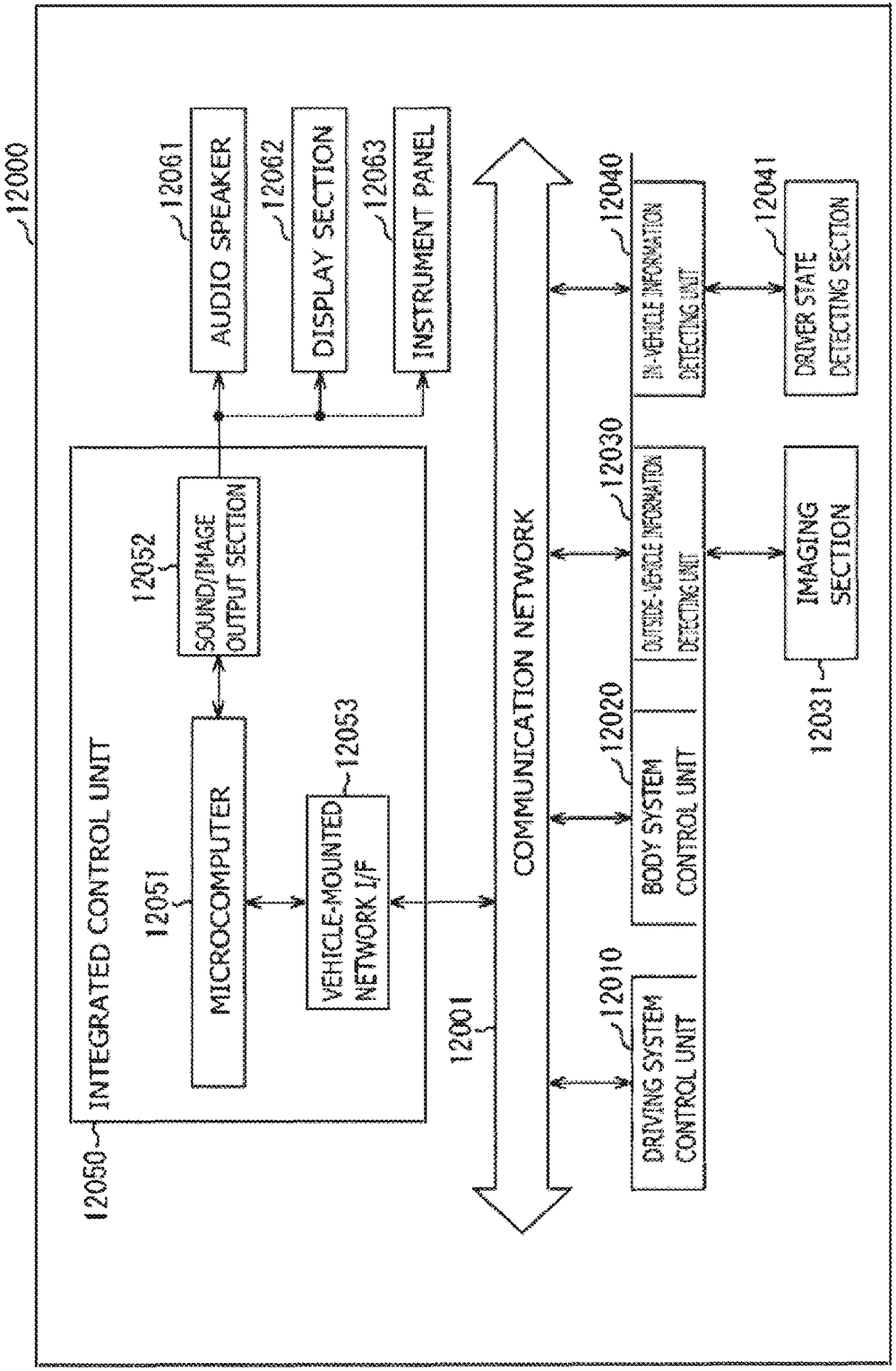

[Fig. 26]
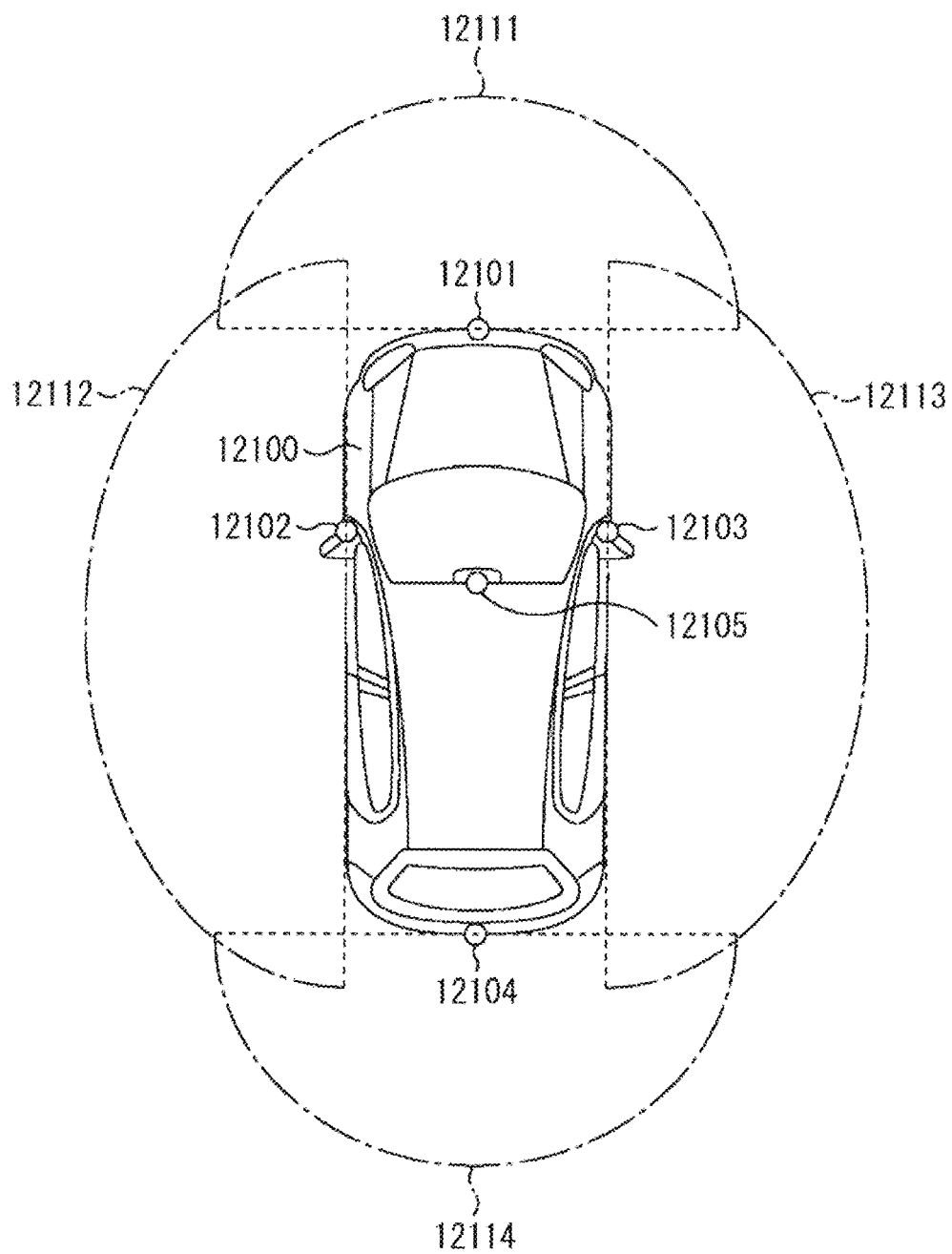

SEMICONDUCTOR ELEMENT AND ELECTRONIC APPARATUS

CROSS REFERENCE TO RELATED APPLICATIONS

This application claims priority to Japanese Priority Patent Application JP 2019-219712 filed on Dec. 4, 2019, the entire contents of which are incorporated herein by reference.

TECHNICAL FIELD

The present disclosure relates to a semiconductor element and an electronic apparatus including the semiconductor element. The semiconductor element is used in an infrared sensor, for example.

BACKGROUND ART

Image sensors or infrared sensors having sensitivity within an infrared region have been commercially available. For example, PTL 1 discloses a semiconductor element. In the semiconductor element, an element substrate and a circuit substrate are bonded to each other through Cu—Cu bonding. In the element substrate, a compound semiconductor layer and a wiring layer are layered with each other.

CITATION LIST

Patent Literature

[PTL 1] International Publication No. WO2018/194030

SUMMARY

Technical Problem

In such a semiconductor element as described above, improved electrical characteristics have now been demanded.

It is desirable to provide a semiconductor element and an electronic apparatus making it possible to improve electrical characteristics.

Solution to Problem

According to an embodiment of the present disclosure, a light-detecting device is provided. The light-detecting device includes a first substrate including a first electrode, a semiconductor layer including a compound semiconductor material, a first insulating film, and a via; a second substrate that faces the first substrate and is electrically connected to the semiconductor layer through the via. The first electrode includes a first portion and the second portion, and the first portion of the first electrode is in contact with the semiconductor layer, and the second portion is in contact with both the first insulating film and the via.

According to an embodiment of the present disclosure, a method of manufacturing a light-detecting device is provided. The method includes forming a first substrate including a first electrode, a semiconductor layer including a compound semiconductor material, a first insulating film, and a via; and forming a second substrate that faces the first substrate and is electrically connected to the semiconductor layer through the via. The first electrode includes a first portion and the second portion, and the first portion is in contact with the semiconductor layer, and the second portion is in contact with both the first insulating film and the via.

According to an embodiment of the present disclosure, an electronic apparatus is provided. The electronic apparatus includes a light-detecting device. The light-detecting device includes a first substrate including a first electrode, a semiconductor layer including a compound semiconductor material, a first insulating film, and a via; a second substrate that faces the first substrate and is electrically connected to the semiconductor layer through the via. The first electrode includes a first portion and the second portion, and the first portion is in contact with the semiconductor layer, and the second portion is in contact with both the first insulating film and the via. According to the present technology, the contact between the first electrode and the via including a through silicon via or a through wiring line can be improved. It should be understood that the effects described herein are not necessarily limited, and the effect may be any one of the effects described in the description or an effect different from the effects.

BRIEF DESCRIPTION OF DRAWINGS

The accompanying drawings are included to provide a further understanding of the technology, and are incorporated in and constitute a part of this specification. The drawings show illustrative embodiments and, together with the specification, serve to explain various principles of the technology.

FIG. 1 is a schematic cross-sectional view illustrating a configuration example of a light receiving element according to an embodiment of the present disclosure.

FIG. 2 is a schematic plan view illustrating an outline configuration of the light receiving element illustrated in FIG. 1.

FIG. 3A illustrates a schematic cross-sectional view (A) and a schematic plan view (B) of a main part of the light receiving element illustrated in FIG. 1.

FIG. 3B is a schematic plan view illustrating another arrangement example of a coupling portion and vias, as illustrated in FIG. 3A.

FIG. 3C is a schematic plan view illustrating still another arrangement example of a coupling portion and vias, as illustrated in FIG. 3A.

FIG. 3D is a schematic plan view illustrating still another arrangement example of coupling portions and a via, as illustrated in FIG. 3A.

FIG. 3E is a schematic plan view illustrating still another arrangement example of coupling portions and vias, as illustrated in FIG. 3A.

FIG. 4 is a characteristic diagram illustrating a relationship, acquired through simulations, between film thickness of InP and light absorption rate at wavelengths.

FIG. 5 is a schematic view illustrating a configuration example of a passivation film in the light receiving element illustrated in FIG. 1.

FIG. 6A is a schematic cross-sectional view illustrating a step of a manufacturing method of the light receiving element illustrated in FIG. 1.

FIG. 6B is a schematic cross-sectional view illustrating a step, following FIG. 6A.

FIG. 6C is a schematic cross-sectional view illustrating a step, following FIG. 6B.

FIG. 7 is a schematic plan view illustrating an example of the step in FIG. 6C.

FIG. 8 is a schematic plan view illustrating another configuration example 1 of a semiconductor layer illustrated in FIG. 7.

FIG. 9A is a schematic plan view illustrating still another configuration example 2 of the semiconductor layer illustrated in FIG. 7.

FIG. 9B is a schematic view illustrating a cross-sectional configuration taken along a line II-II' illustrated in FIG. 9A.

FIG. 10A is a schematic cross-sectional view illustrating a step, following FIG. 6C.

FIG. 10B is a schematic cross-sectional view illustrating a step, following FIG. 10A.

FIG. 11A is a schematic view illustrating an example of the planar configuration of the step illustrated in FIG. 10A.

FIG. 11B is a schematic view illustrating an example of the planar configuration of the step illustrated in FIG. 10B.

FIG. 12A is a schematic view illustrating another example 1 of the planar configuration of the step illustrated in FIG. 10A.

FIG. 12B is a schematic view illustrating another example 1 of the planar configuration of the step illustrated in FIG. 10B.

FIG. 13A is a schematic view illustrating still another example 2 of the planar configuration of the step illustrated in FIG. 10A.

FIG. 13B is a schematic view illustrating still another example 2 of the planar configuration of the step illustrated in FIG. 10B.

FIG. 14 is a schematic cross-sectional view illustrating still another example 1 of the step illustrated in FIG. 10B.

FIG. 15 is a schematic cross-sectional view illustrating still another example 2 of the step illustrated in FIG. 10B.

FIG. 16A is a schematic cross-sectional view illustrating a step following the step illustrated in FIG. 10B.

FIG. 16B is a schematic cross-sectional view illustrating a step following the step illustrated in FIG. 16A.

FIG. 16C is a schematic cross-sectional view illustrating a step following the step illustrated in FIG. 16B.

FIG. 16D is a schematic cross-sectional view illustrating a step following the step illustrated in FIG. 16C.

FIG. 16E is a schematic cross-sectional view illustrating a step following the step illustrated in FIG. 16D.

FIG. 16F is a schematic cross-sectional view illustrating a step following the step illustrated in FIG. 16E.

FIG. 16G is a schematic cross-sectional view illustrating a step following the step illustrated in FIG. 16F.

FIG. 16H is a schematic cross-sectional view illustrating a step following the step illustrated in FIG. 16G.

FIG. 16I is a schematic cross-sectional view illustrating a step following the step illustrated in FIG. 16H.

FIG. 16J is a schematic cross-sectional view illustrating a step following the step illustrated in FIG. 16I.

FIG. 16K is a schematic cross-sectional view illustrating a step following the step illustrated in FIG. 16J.

FIG. 17A is a schematic cross-sectional view of a modification example 1 of the present disclosure, illustrating another example of the manufacturing method of the light receiving element illustrated in FIG. 1.

FIG. 17B is a schematic cross-sectional view illustrating a step following the step illustrated in FIG. 17A.

FIG. 18A is a schematic cross-sectional view of a modification example 2 of the present disclosure, illustrating still another example of the manufacturing method of the light receiving element illustrated in FIG. 1.

FIG. 18B is a schematic cross-sectional view illustrating a step the step illustrated in following FIG. 18A.

FIG. 18C is a schematic cross-sectional view illustrating a step following the step illustrated in FIG. 18B.

FIG. 18D is a schematic cross-sectional view illustrating a step following the step illustrated in FIG. 18C.

FIG. 18E is a schematic cross-sectional view illustrating a step following the step illustrated in FIG. 18D.

FIG. 18F is a schematic cross-sectional view illustrating a step following the step illustrated in FIG. 18E.

FIG. 19 is a schematic cross-sectional view illustrating a configuration example of a light receiving element according to a modification example 3 of the present disclosure.

FIG. 20 is a block diagram illustrating a configuration of an imaging device.

FIG. 21 is a schematic view illustrating a configuration example of a laminated-type imaging device.

FIG. 22 is an operational block diagram illustrating an example electronic apparatus, e.g., a camera, including the imaging device illustrated in FIG. 20.

FIG. 23 is a view depicting an example of a schematic configuration of an endoscopic surgery system.

FIG. 24 is a block diagram depicting an example of a functional configuration of a camera head and a camera control unit (CCU).

FIG. 25 is a block diagram depicting an example of schematic configuration of a vehicle control system.

FIG. 26 is a diagram of assistance in explaining an example of installation positions of an outside-vehicle information detecting section and an imaging section.

DESCRIPTION OF EMBODIMENTS

In the following, some embodiments of the present disclosure are described in detail with reference to the accompanying drawings. The embodiments described below are specific but non-limiting examples of the present disclosure, and the present disclosure is not limited to aspects described below. The present disclosure is not also limited to arrangements, sizes, dimensional ratios, and other factors of components illustrated in the drawings. It is to be noted that the description is given in the following order.

1. Embodiment: example of light receiving element in which via is coupled to substantially planar face of expanded portion of first electrode
   1-1. Configuration of Light Receiving Element
   1-2. Manufacturing Method of Light Receiving Element
   1-3. Operation of Light Receiving Element
   1-4. Workings and Effects
2. Modification Examples
   2-1. Modification Example 1: another example of a manufacturing method
   2-2. Modification Example 2: still another example of the manufacturing method
   2-3. Modification Example 3: an example of a light receiving element including a color filter and an on-chip lens on a side adjacent to light incident face
3. Application Examples
4. Applied Examples

1. EMBODIMENT

FIG. 1 schematically illustrates a cross-sectional configuration example of a semiconductor element (a light receiving element 1) according to an embodiment of the present disclosure. FIG. 2 schematically illustrates a planar configuration of the light receiving element 1 illustrated in FIG. 1. It is to be noted that FIG. 1 illustrates a cross-sectional configuration taken along a line I-I' illustrated in FIG. 2. The light receiving element 1 is applied, for example, to an infrared sensor including a compound semiconductor material such as a group III-V semiconductor. The light receiving element 1 photoelectrically converts light into light at a wavelength within a region from a visible region (for example, from 380 nm or above to below 780 nm) to a short infrared region (for example, from 780 nm or above to below 2400 nm). The light receiving element 1 has a plurality of light-receiving unit regions serving as pixels P two-dimensionally arranged, for example.

1-1. Configuration of Light Receiving Element

The light receiving element 1 has a laminated structure of an element substrate 10 and a read-out circuit substrate 20, as illustrated in FIG. 1. The element substrate 10 has one surface serving as a light incident face S1, and the other face opposite to the light incident face S1 and serving as a bonding face S2 with the read-out circuit substrate 20.

The element substrate 10 includes, from a position adjacent to the read-out circuit substrate 20, a wiring layer 10W, first electrodes 11, a semiconductor layer 10S, a second electrode 15, and passivation films 16A and 16B in this order. The semiconductor layer 10S has a counter surface facing the wiring layer 10W and end faces (side surfaces). The counter face and the end faces are covered with insulating films 17A and 17B. The read-out circuit substrate 20 is a so-called a read-out integrated circuit (ROIC). The read-out circuit substrate 20 includes a wiring layer 20W in contact with the bonding face S2 of the element substrate 10, a multi-layered wiring layer 22C, and a semiconductor substrate 21. The semiconductor substrate 21 faces the element substrate 10 across the wiring layer 20W and the multi-layered wiring layer 22C.

The element substrate 10 has an element region R1 in its central part. The element region R1 serves as a light receiving region. The semiconductor layer 10S is disposed in the element region R1. In other words, the element region R1 represents a region where the semiconductor layer 10S is provided. The element region R1 includes an optical black (OPB) region R1B lying adjacent to a peripheral region R2 and covered with an electrically-conductive film 15B. The OPB region R1B is provided to surround the light receiving region. The OPB region R1B is used to acquire a pixel signal at a black level.

The peripheral region R2 is provided outside the element region R1 and surrounds the element region R1. In the peripheral region R2 of the element substrate 10, a buried layer 18 is provided, together with the insulating films 17A and 17B. In the peripheral region R2, through holes H1 and H2 are further provided. The through holes H1 and H2 pass through the element substrate 10 and reach the read-out circuit substrate 20. In the light receiving element 1, light is outputted from the light incident face S1 of the element substrate 10, via the passivation films 16A and 16B, the second electrode 15, and a second contact layer 14, to the semiconductor layer 10S. Signal electric charges having undergone photoelectric conversion in the semiconductor layer 10S move, via the wiring layer 10W, to the read-out circuit substrate 20. The read-out circuit substrate 20 then reads the signal electric charges. Configurations of these components will now be described herein.

The wiring layer 10W is provided across the element region R1 and the peripheral region R2. The wiring layer 10W includes the bonding face S2 with the read-out circuit substrate 20. In the light receiving element 1 in which the bonding face S2 of the element substrate 10 is provided across the element region R1 and the peripheral region R2, the bonding face S2 is flush across the element region R1 and the peripheral region R2, for example.

The wiring layer 10W includes, in interlayer insulating films 19A and 19B, for example, contact electrodes 19E and dummy electrodes 19ED. In the wiring layer 10W, for example, the interlayer insulating film 19B is disposed adjacent to the read-out circuit substrate 20, and the interlayer insulating film 19A is disposed adjacent to a first contact layer 12. The interlayer insulating films 19A and 19B are laminated to each other. The interlayer insulating films 19A and 19B each include, for example, an inorganic insulating material. Non-limiting examples of the inorganic insulating material include, for example, silicon nitride (SiN), aluminum oxide ($Al_2O_3$), silicon oxide ($SiO_2$), and hafnium oxide ($HfO_2$). The interlayer insulating films 19A and 19B may include an identical inorganic insulating material.

The contact electrodes 19E are provided in the element region R1, for example. The contact electrodes 19E electrically couple with each other the first electrodes 11 and the read-out circuit substrate 20. The contact electrodes 19E are provided in the respective pixels P in the element region R1. The contact electrodes 19E adjacent to each other is electrically separated by the buried layer 18 and the interlayer insulating films 19A and 19B. The contact electrodes 19E include copper (Cu) pads, for example. The contact electrodes 19E are exposed to the bonding face S2. The dummy electrodes 19ED are provided in the peripheral region R2, for example. The dummy electrodes 19ED are coupled to respective dummy electrodes 22ED in the wiring layer 20W described later. The dummy electrodes 19ED and the dummy electrodes 22ED provided as described above make it possible to improve the strength of the peripheral region R2. The dummy electrodes 19ED and the contact electrodes 19E are formed in a single step, for example. The dummy electrodes 19ED include copper (Cu) pads, for example. The dummy electrodes 19ED are exposed to the bonding face S2.

The first electrodes 11 provided between the contact electrodes 19E and the semiconductor layer 10S serve as electrodes or anodes that receive a voltage for use in reading signal electric charges generated in a photoelectric conversion layer 13. The signal electric charges may be holes or electrons. Hereinafter, the signal electric charges are described as being holes for purpose of convenience. The first electrodes 11 are provided in the respective pixels P in the element region R1. The first electrodes 11 are provided so as to fill respective openings 17H of the insulating film 17A. The first electrodes 11 are in contact with the semiconductor layer 10S, more specifically, respective diffusion regions 12A described later.

FIG. 3A schematically illustrates a main part of the light receiving element 1 according to the present embodiment. That is, FIG. 3A schematically illustrates a cross-sectional structure (A) and a planar structure (B) of a coupling portion between the first electrode 11 and the contact electrode 19E and its peripheral part. In plan view, the first electrode 11 has a shape greater in size than the opening 17H of the insulating film 17A. The first electrode 11 is partially provided in the buried layer 18. In other words, the first electrode 11 includes a coupling portion 11X and an expanded portion 11Y. The coupling portion 11X is in contact with the semiconductor layer 10S in the opening 17H. The insulating film 17A lies between the semiconductor layer 10S and the expanded portion 11Y.

The expanded portion 11Y is formed to extend around the coupling portion 11X. In one example illustrated in Part (B)

of FIG. 3A, the first electrode 11 has a substantially rectangular shape in a plan view. The first electrode 11 is formed asymmetrically about the coupling portion 11X and the opening 17H, for example. That is, the first electrode 11 lies at a position shifted in an X-axis direction with respect to the coupling portion 11X and the opening 17H, for example. The expanded portion 11Y formed asymmetrically with respect to the coupling portion 11X makes it possible to improve area efficiency. The first electrode 11 has a surface facing the bonding face S2 and being a substantially planar excluding a portion above the substantially circular opening 17H, for example. Above the opening 17H, a substantially circular recess, serving as a concave portion 11C, is formed. That is, the expanded portion 11Y is formed on the insulating film 17A such that a width W1 from one peripheral part of the concave portion 11C to one end of one of paired opposite sides of the expanded portion 11Y in the X-axis direction differs from a width W2 from another peripheral part of the concave portion 11C to one end of the other of the paired opposite sides of the expanded portion 11Y. For example, the width W1 is greater than the width W2 (W1>W2).

In the present embodiment, as illustrated in FIG. 3A, a via 19V extending from the contact electrode 19E is coupled to the expanded portion 11Y of the first electrode 11. The first electrode 11 and the contact electrode 19E are thus electrically coupled to each other. In particular, in a case where the expanded portion 11Y is formed asymmetrically about the coupling portion 11X, as illustrated in FIGS. 1 and 3A, for example, the via 19V is coupled to a region along the relatively wider width W1 of the expanded portion 11Y. The first electrode 11 and the contact electrode 19E are electrically coupled to each other via the wider region. The via 19V corresponds to a specific but non-limiting example of a "through wiring line" and/or a "through silicon via" in an embodiment of the present disclosure.

The via 19V coupled to the expanded portion 11Y of the first electrode 11 couples the first electrode 11 and the contact electrode 19E to each other, as described above. The configuration improves ease of contact between the first electrode 11 and the via 19V. With the expanded portion 11Y at which the first electrode 11 and the via 19V are coupled to each other, it is also possible to reduce the area of the opening 17H through which the first electrode 11 and the semiconductor layer 10S are electrically coupled to each other. This helps prevent a dark current from occurring. Furthermore, the expanded portion 11Y is formed asymmetrically on the insulating film 17A with the wider region coupling to the via 19V. The configuration increases the diameter of the via 19V and thus reduces contact resistance between the first electrode 11 and the contact electrode 19E.

It is to be noted that the present disclosure is not limited to such an example as illustrated in FIG. 3A. In the example, the first electrodes 11 have the respective coupling portions 11X and are coupled to the respective vias 19V. Alternatively, each of the first electrodes 11 may have two or more coupling portions 11X and/or may be coupled to two or more vias 19V. In such an example where each of the first electrodes 11 has the two or more coupling portions 11X and are coupled to the two or more the vias 19V, it is possible to secure electrical coupling even if a disconnection occurs in one of the coupling portions 11X and the vias 19V. In an embodiment, the electrode area of the first electrode 11 can be reduced to minimize the capacitance of the first electrode 11. For example, the size and/or shape of the first electrode 11 can be changed. The first electrode 11 may have a square shape, a rectangular shape or a circular shape that covers at least the via 19V and the opening 17H/the coupling portion 11X.

The first electrode 11 is, for example, a metal of titanium (Ti), tungsten (W), titanium nitride (TiN), platinum (Pt), gold (Au), germanium (Ge), palladium (Pd), zinc (Zn), nickel (Ni) or aluminum (Al) or a metal alloy including at least one of them. The first electrode 11 may be a single-layer film including such a constituent material as described above. The first electrode 11 may otherwise be a multi-layered film including such two or more constituent materials as described above. For example, the first electrode 11 is a multi-layered film including titanium and tungsten. The first electrode 11 ranges in thickness from several ten nm to several hundred nm, for example.

The semiconductor layer 10S includes, from a position adjacent to the wiring layer 10W, the first contact layer 12, the photoelectric conversion layer 13, and the second contact layer 14 for example. The first contact layer 12, the photoelectric conversion layer 13, and the second contact layer 14 have respective planar shapes identical to each other and respective end faces disposed at identical positions in plan view.

The first contact layer 12 is commonly provided across all the pixels P, for example. The first contact layer 12 is disposed between the insulating film 17A and the photoelectric conversion layer 13. The first contact layer 12 electrically separates the pixels P adjacent to each other. In the first contact layer 12, the plurality of diffusion regions 12A is provided, for example. Using, in the first contact layer 12, a compound semiconductor material greater in band gap than a compound semiconductor material included in the photoelectric conversion layer 13 makes it possible to suppress a dark current. The first contact layer 12 may include, for example, n-type indium phosphide (InP).

The diffusion regions 12A provided and disposed in the first contact layer 12 are separated away from each other. The diffusion regions 12A are provided in the respective pixels P. The first electrodes 11 is coupled to the diffusion regions 12A. The OPS region R1B also includes the diffusion regions 12A. The diffusion regions 12A are used to read signal electric charges generated in the photoelectric conversion layer 13 from the respective pixels P. The diffusion regions 12A include a p-type impurity, for example. Non-limiting examples of the p-type impurity include zinc (Zn). As described above, pn bonding interfaces are respectively formed between the diffusion regions 12A and the first contact layer 12 excluding the diffusion regions 12A to electrically separate the pixels P adjacent to each other. The diffusion regions 12A are provided in a thickness direction of the first contact layer 12, for example. The diffusion regions 12A are also partially provided in the thickness direction of the photoelectric conversion layer 13.

The photoelectric conversion layer 13 between the first electrodes 11 and the second electrode 15, more specifically, between the first contact layer 12 and the second contact layer 14 is commonly provided across all the pixels P, for example. The photoelectric conversion layer 13 absorbs light at a predetermined wavelength to generate signal electric charges. The photoelectric conversion layer 13 includes, for example, a compound semiconductor material such as an i-type group III-V semiconductor. Non-limiting examples of the compound semiconductor material included in the photoelectric conversion layer 13 include, for example, indium gallium arsenide (InGaAs), indium arsenic antimony (InAsSb), indium arsenide (InAs), indium antimony (InSb), and mercury cadmium telluride (HgCdTe).

The photoelectric conversion layer 13 may include germanium (Ge). In the photoelectric conversion layer 13, for example, light at a wavelength within a region from the visible region to the short infrared region undergoes photoelectric conversion.

The second contact layer 14 is commonly provided across all the pixels P, for example. The second contact layer 14 is provided between and in contact with the photoelectric conversion layer 13 and the second electrode 15. Electric charges discharged from the second electrode 15 move to the second contact layer 14. The second contact layer 14 includes, for example, a compound semiconductor including an n-type impurity. The second contact layer 14 may include, for example, n-type indium phosphide (InP).

It is to be noted that a light absorption rate of the compound semiconductor included in the second contact layer 14 changes in accordance with a wavelength. Adjusting a film thickness of the second contact layer 14 therefore makes it possible to allow light at a wavelength within a desired wavelength band to reach the photoelectric conversion layer 13. For example, FIG. 4 is a characteristic diagram illustrating a simulated relationship between the thickness of the InP film and the light absorption rate at each wavelength. It is desirable that, to allow light at a wavelength within the visible region to reach the photoelectric conversion layer 13, the second contact layer 14 have a thickness in a range from 5 nm to 300 nm, for example. The second contact layer (InP film) 14 having a thickness within this range allows the visible light at a wavelength of 600 nm to pass through at a light absorption rate ranging from 0% to 90% inclusive. To allow only light at a wavelength within the short infrared region to reach the photoelectric conversion layer 13, it is sufficient that the second contact layer 14 have a thickness in a range from 5 nm to 750 μm, for example. Adjusting the thickness of the second contact layer 14 as described above makes it possible to allow light at a wavelength within the visible region, as well as light at a wavelength within the short infrared region, to undergo photoelectric conversion in the photoelectric conversion layer 13.

Similar to the second contact layer 14, the light absorption rate of the photoelectric conversion layer 13 including a compound semiconductor also changes in accordance with a wavelength. It is therefore desirable that, to allow blue light at a wavelength of 400 nm, serving as light within the visible region, to undergo photoelectric conversion in the photoelectric conversion layer 13, for example, the photoelectric conversion layer 13 have a thickness of 100 nm or greater, for example. It is also desirable that, to allow light at a wavelength within the short infrared region to undergo photoelectric conversion, the photoelectric conversion layer 13 have a thickness of 3 μm or greater, for example. Furthermore, it is desirable that, to allow light at a wavelength within a region from the visible region to the short infrared region to undergo photoelectric conversion, the photoelectric conversion layer 13 have a thickness in a range from 500 nm to 6 μm, for example.

The second electrode 15 serves as a common electrode among the pixels P, for example. The second electrode 15 is provided on and in contact with a light-incident side of the second contact layer 14. The second electrode 15 serves as a cathode to discharge electric charges that do not serve as signal electric charges, among electric charges generated in the photoelectric conversion layer 13. For example, in a case where holes are read from the first electrodes 11 as signal electric charges, the second electrode 15 discharges electrons. The second electrode 15 includes an electrically-conductive film allowing incident light such as infrared light to pass through, for example. The second electrode 15 may include, for example, indium tin oxide (ITO) or ITiO ($In_2O_3$—$TiO_2$).

The passivation films 16A and 16B cover the second electrode 15 from a side of the light incident face S1. It is desirable that the passivation films 16A and 16B each include a material that does not absorb light at a wavelength within a region from the visible region (from 380 nm or greater to less than 780 nm, for example) to the short infrared region (from 780 nm or greater to less than 2400 nm, for example). The passivation films 16A and 16B may include an identical material. Alternatively, the passivation films 16A and 16B may respectively include materials different from each other. Furthermore, the passivation films 16A and 16B may have anti-reflection properties. The passivation films 16A and 16B may be formed through an atomic layer deposition (ALD) method, a chemical vapor deposition (CVD) method, a physical vapor deposition (PVD) method, or an application method, for example.

The passivation film 16A is provided on the second electrode 15, as described above. The passivation film 16A extends to chip ends E in the peripheral region R2, for example. The passivation film 16A has an opening 16H in the OPB region R1B. The opening 16H has a frame shape so as to surround the light receiving region, as illustrated in FIG. 2, for example. Alternatively, the opening 16H may be a square or circular hole in plan view, for example. Via the opening 16H of the passivation film 16A, the electrically-conductive film 15B, described later, is electrically coupled to the second electrode 15.

It is desirable that the passivation film 16A include a material having non-reducing properties. Non-limiting examples of the material having non-reducing properties include, for example, oxides ($M_xO_y$), nitrides ($M_xN_y$), and oxynitrides ($M_xO_yN_z$). M represents, for example, silicon (Si), titanium (Ti), hafnium (Hf), zirconium (Zr), or yttrium (Y), for example. The letters x, y, and z each represent an integer of 1 or greater. It is desirable to apply a film forming method without using a reducing gas to silicon nitride (SiN). Non-limiting examples of such a film forming method include, for example, a sputtering method and an application method. The passivation film 16A may be formed into a single-layer film including such a material as described above, for example. It is desirable that, to provide the passivation film 16A as a single-layer film, the single-layer film have a film density of 2.0 g/cm$^3$ or higher. Any particular upper limit is not specified for the film density. The film density may be 8.0 g/cm$^3$ or lower, for example. It is to be noted that the film density is defined with an expression: Mass of thin film/Volume (g/cm$^3$). The film density is acquired through an x-ray reflectivity (XRR) measurement method, for example. The passivation film 16A therefore has sealing properties. Alternatively, the passivation film 16A may be formed into a multi-layered film. Furthermore, the passivation film 16A may be a multi-layered film including three or more layers, i.e., films 16A1, 16A2, 16A3, 16A4, to 16AX, laminated on the second electrode 15, as illustrated in FIG. 5.

The passivation film 16B is provided to cover the passivation film 16A and the electrically-conductive film 15B. The passivation film 16B extends to the chip ends E in the peripheral region R2, similar to the passivation film 16A, for example. The passivation film 16B may include, for example, silicon nitride (SiN), aluminum oxide ($Al_2O_3$), silicon oxide ($SiO_2$), or tantalum oxide ($Ta_2O_3$). It is to be noted that any particular method of forming a silicon nitride (SiN) film is not specified in forming the passivation film 16B. The passivation film 16B may be a silicon nitride (SiN) film formed through a plasma CVD method using a reducing gas, instead of the sputtering method and the application method.

The insulating films 17A and 17B are provided between the first contact layer 12 and the buried layer 18. Specifically, the insulating film 17A covers a counter surface, facing the wiring layer 10W, of the first contact layer 12. The insulating film 17A further covers end faces of the first contact layer 12, end faces of the photoelectric conversion layer 13, end faces of the second contact layer 14, and end faces of the second electrode 15. In the peripheral region R2, the insulating film 17A is in contact with the passivation films 16A and 16B. The insulating film 17B is provided along and in contact with the first electrodes 11 and the insulating film 17A. In other words, the insulating film 17B covers a bonding face of the first contact layer 12 with the first electrodes 11 and the insulating film 17A interposed. The insulating film 17B also covers the end faces of the first contact layer 12, the end faces of the photoelectric conversion layer 13, the end faces of the second contact layer 14, and the end faces of the second electrode 15 with the insulating film 17A interposed. In the peripheral region R2, the insulating film 17B extends, together with the insulating film 17A, to the chip ends E, for example. In more detail, the insulating film 17B covers the end faces of the first contact layer 12, the end faces of the photoelectric conversion layer 13, and the end faces of the second contact layer 14 with the insulating film 17A and a later-described metal film 11A remaining on the side surfaces of the semiconductor layer 10S interposed.

The insulating film 17A includes, for example, oxide such as silicon oxide ($SiO_x$) or aluminum oxide ($Al_2O_3$). The insulating film 17A may have a layered structure including a plurality of films. The insulating film 17A may include, for example, a silicon (Si)-based insulating material such as silicon oxynitride (SiON), carbon-containing silicon oxide (SiOC), silicon nitride (SiN), or silicon carbide (SiC). The insulating film 17A has a thickness in a range from several ten nm to several hundred nm, for example. It is desirable that the insulating film 17B include a material having high passivation properties, among such above-described insulating materials as a material of the insulating film 17A. It is desirable to use silicon nitride (SiN), for example. It is therefore possible to improve the semiconductor layer 10S in protection properties. The insulating film 17B has a thickness in a range from 100 nm to 200 nm, for example.

The electrically-conductive film 15B extends from the OPB region R1B to the through holes H1 in the peripheral region R2. The electrically-conductive film 15B is in contact with the second electrode 15 via the opening 16H, provided in the OPB region R1B, of the passivation film 16A. The electrically-conductive film 15B is also in contact with wiring lines of the read-out circuit substrate 20 (wiring lines 22CB described later) via the through holes H1. A voltage is therefore supplied from the read-out circuit substrate 20, via the electrically-conductive film 15B, to the second electrode 15. The electrically-conductive film 15B serves as a path along which the voltage is supplied to the second electrode 15, as described above. The electrically-conductive film 15B also serves as a light shielding film. The electrically-conductive film 15B forms the OPB region R1B. The electrically-conductive film 15B includes, for example, a metal material such as tungsten (W), aluminum (Al), titanium (Ti), molybdenum (Mo), tantalum (Ta), or copper (Cu). The passivation film 16B may be provided on the electrically-conductive film 15B.

An adhesion layer B may be provided between end parts of the second contact layer 14 and the second electrode 15. The adhesion layer B is used to form the light receiving element 1, as will be described later. The adhesion layer B bonds the semiconductor layer 10S to a temporary substrate 33 described later and illustrated in FIG. 6C. The adhesion layer B includes, for example, tetraethoxysilane (TEOS) or silicon oxide (SiO). The adhesion layer B has a width greater than those of the end faces of the semiconductor layer 10S, for example. The adhesion layer B and the semiconductor layer 10S are covered with the buried layer 18. The insulating films 17A and 17B are provided between the adhesion layer B and the buried layer 18.

The adhesion layer B may extend across a large part of the peripheral region R2. For example, the adhesion layer B may extend from positions adjacent to edges of the semiconductor layer 10S, i.e., the element region R1, to respective positions between the through holes H1 and the through holes H2. The adhesion layer B may otherwise extend from positions adjacent to the edges of the semiconductor layer 10S, i.e., the element region R1, to the chip ends, i.e., the chip ends E.

In manufacturing steps of the light receiving element 1, level differences between the semiconductor layer 10S and the temporary substrate 33, which is described later and illustrated in FIG. 6C, are filled with the buried layer 18. As will be described later in detail, the buried layer 18 formed as described above suppresses the occurrence of inconveniences due to the level differences between the semiconductor layer 10S and the temporary substrate 33 in the manufacturing steps.

In the peripheral region R2, the buried layer 18 is provided between the wiring layer 10W and the insulating film 17B, and between the wiring layer 10W and the passivation film 16A. For example, the buried layer 18 is greater in thickness than the semiconductor layer 10S. In the present embodiment, the buried layer 18 is provided to surround the semiconductor layer 10S, forming the peripheral region R2 around the semiconductor layer 10S. It is therefore possible to provide the bonding face S2 with the read-out circuit substrate 20 in the peripheral region R2. In a case where the bonding face S2 is formed in the peripheral region R2, the thickness of the buried layer 18 may be reduced. It is however desirable that the buried layer 18 cover the semiconductor layer 10S in the thickness direction. It is further desirable that the buried layer 18 wholly cover the end faces of the semiconductor layer 10S. The buried layer 18 wholly covering the end faces of the semiconductor layer 10S via the insulating films 17A and 17B makes it possible to effectively suppress moisture from entering the semiconductor layer 10S. In the element region R1, the buried layer 18 is provided between the semiconductor layer 10S and the wiring layer 10W to cover the first electrodes 11.

The buried layer 18 has a planarized surface facing the bonding face S2. In the peripheral region R2, the wiring layer 10W is provided along the planarized face of the buried layer 18. The buried layer 18 may include an inorganic insulating material, such as silicon oxide ($SiO_x$), silicon nitride (SiN), silicon oxynitride (SiON), carbon-containing silicon oxide (SiOC), or silicon carbide (SiC).

In the manufacturing steps of the light receiving element 1, the buried layer 18 is first formed, and the wiring layer 10W including the interlayer insulating films 19A and 19B and the contact electrodes 19E is then formed above the buried layer 18, as illustrated in FIG. 16E described later. The read-out circuit substrate 20 including the wiring layer 20W is bonded to the element substrate 10 including the wiring layer 10W to form the light receiving element 1, as illustrated in FIG. 16F described later. The contact electrodes 19E in the wiring layer 10W and contact electrodes 22E in the wiring layer 20W are coupled to each other. The contact electrodes 19E and 22E include respective Cu pads, for example. As the Cu pads are directly bonded to each other, the contact electrodes 19E and the contact electrodes 22E are coupled to each other. To use a chemical mechanical polishing (CMP) method to form the contact electrodes 19E, the buried layer 18 disposed below a copper film to be polished should be hard enough to withstand the stress during polishing. To directly bond the Cu pads of the contact electrodes 19E and 22E to each other, the element substrate 10 and the read-out circuit substrate 20 should be highly planarized. It is therefore desirable that the buried layer 18 disposed below the copper film be hard enough to withstand the stress during polishing. Specifically, it is desirable that a constituent material of the buried layer 18 be a material higher in hardness than a sealant or an organic material disposed around dies in an ordinary semiconductor package. Non-limiting examples of such a material having high hardness include inorganic insulating materials. Forming a film of such an inorganic insulating material through a chemical vapor deposition (CVD) method, a sputtering method, or otherwise a coating method, for example, makes it possible to form the buried layer 18. However, in another embodiment, the element substrate 10 and the read-out circuit substrate 20 is electrically connected through a bump electrode. Therefore, the electrical charge signal generated from the photoelectric conversion layer 13 is transferred through the bump electrode to the read-out circuit substrate 20. The bump electrode may be provided on a surface of the element substrate 10, in the element substrate 10 or in the read-out circuit substrate 20 according to different embodiments.

The buried layer 18 includes the through holes H1 and H2 extending through the buried layer 18. The through holes H1 and H2 extend through the wiring layer 10W and the buried layer 18 to the read-out circuit substrate 20. The through holes H1 and H2 have a square planar shape, for example. The through holes H1 and H2 are provided to surround the element region R1, as illustrated in FIG. 2. The through holes H1 are provided closer in position to the element region R1 than the through holes H2. The electrically-conductive film 15B covers side walls and bottom surfaces of the through holes H1. Via the through holes H1, the electrically-conductive film 15B of the second electrode 15 and the wiring lines 22CB, described later, of the read-out circuit substrate 20 are coupled to each other. The through holes H1 extend through the passivation film 16A, the buried layer 18, and the wiring layer 10W.

The through holes H2 are provided closer in position to the chip ends E than the through holes H1, for example. The through holes H2 extend through the passivation films 16A and 16B, the buried layer 18, and the wiring layer 10W to pad electrodes 22P, described later, of the read-out circuit substrate 20. Via the through holes H2, the light receiving element 1 achieves external electrical coupling. Alternatively, the through holes H1 and H2 may not extend to the read-out circuit substrate 20. For example, the through holes H1 and H2 may extend to the wiring lines in the wiring layer 10W. The wiring lines may be coupled to the wiring lines 22CB and the pad electrodes 22P in the read-out circuit substrate 20. In a case where the adhesion layer B extends from positions adjacent to the edges of the semiconductor layer 10S, i.e., the element region R1, to positions between the through holes H1 and the through holes H2, or otherwise, to the chip ends, i.e., the chip ends E, as described above, the through holes H1 and H2 may pass through the adhesion layer B.

Holes and electrons generated in the photoelectric conversion layer 13 are to be read from the first electrodes 11 and the second electrode 15. To promptly perform this reading, it is desirable that the first electrodes 11 and the second electrode 15 be provided at a distance sufficient for photoelectric conversion and so as not to excessively separated away from each other. That is, it is desirable to reduce the thickness of the element substrate 10. For example, the distance between the first electrodes 11 and the second electrode 15 or the thickness of the element substrate 10 is preferably 10 µm or less, more preferably 7 µm or less, or still more preferably 5 µm or less.

The semiconductor substrate 21 of the read-out circuit substrate 20 faces the element substrate 10 across the wiring layer 20W and the multi-layered wiring layer 22C. The semiconductor substrate 21 includes silicon (Si), for example. A plurality of transistors is provided adjacent to a surface, facing the wiring layer 20W, of the semiconductor substrate 21. For example, the plurality of transistors is used to configure read-out circuits in the respective pixels P. The wiring layer 20W includes, for example, an interlayer insulating film 22A and an interlayer insulating film 22B laminated in this order from a side adjacent to the element substrate 10. For example, the contact electrodes 22E and the dummy electrodes 22ED are provided in the interlayer insulating film 22A. The multi-layered wiring layer 22C is provided to face the element substrate 10 across the wiring layer 20W. For example, the pad electrodes 22P and the plurality of wiring lines 22CB are provided in the multi-layered wiring layer 22C. The interlayer insulating films 22A and 22B each include, for example, an inorganic insulating material. Non-limiting examples of the inorganic insulating material include, for example, silicon nitride (SiN), aluminum oxide ($Al_2O_3$), silicon oxide ($SiO_2$), and hafnium oxide ($HfO_2$).

The contact electrodes 22E electrically couple the first electrodes 11 and the wiring lines 22CB with each other. The contact electrodes 22E are provided in the respective pixels P in the element region R1. The contact electrodes 22E are in contact with the respective contact electrodes 19E at the bonding face S2 of the element substrate 10. The interlayer insulating film 22A electrically separates the contact electrodes 22E adjacent to each other.

The dummy electrodes 22ED provided in the peripheral region R2 are in contact with the respective dummy electrodes 19ED at the bonding face S2 of the element substrate 10. The dummy electrodes 22ED and the contact electrodes 22E are formed in a single step, for example. The contact electrodes 22E and the dummy electrodes 22ED include respective copper (Cu) pads, for example. The contact electrodes 22E and the dummy electrodes 22ED are exposed to a counter surface of the read-out circuit substrate 20. The counter surface faces the element substrate 10. That is, the contact electrodes 19E and the contact electrodes 22E, as well as the dummy electrodes 19ED and the dummy electrodes 22ED are respectively bonded to each other through Cu—Cu bonding, for example. As will be described later in detail, such bonding therefore makes it possible to make the pixels P finer.

The wiring lines 22CB coupled to the respective contact electrodes 19E are coupled to the respective transistors provided adjacent to the surface of the semiconductor substrate 21. The first electrodes 11 and the read-out circuits are coupled to each other in the respective pixels P. The wiring lines 22CB coupled to the electrically-conductive film 15B via the through holes H1 each have a predetermined potential, for example. As described above, the read-out circuits read holes, for example, out of electric charges generated in the photoelectric conversion layer 13, from the first electrodes 11 via the contact electrodes 19E and 22E. The remaining electric charges, i.e., electrons, generated in the photoelectric conversion layer 13 are discharged from the second electrode 15 via the electrically-conductive film 15B at the predetermined potential.

The pad electrodes 22P provided in the peripheral region R2 allow external electrical coupling. The through holes H2 extending through the element substrate 10 to the pad electrodes 22P are provided adjacent to the chip ends E of the light receiving element 1. External electrical coupling is thus to be achieved via the through holes H2. For example, such coupling is achieved through a wire bonding method or a humping method. For example, the predetermined potential may be supplied from external terminals disposed in the respective through holes H2 to the second electrode 15 via the through holes H2, the wiring lines 22CB of the read-out circuit substrate 20, and the electrically-conductive film 15B. The read-out circuits in the semiconductor substrate 21 may read, via the contact electrodes 19E and 22E, signal voltages read from the respective first electrodes 11 as a result of photoelectric conversion in the photoelectric conversion layer 13. The signal voltages may be outputted, via the read-out circuits, to the external terminals disposed in the respective through holes H2. Signal voltages may be outputted, via the read-out circuits and other circuits included in the read-out circuit substrate 20, for example, to the external terminals. Non-limiting examples of the other circuits include a signal processing circuit and an output circuit.

It is preferred that the read-out circuit substrate 20 be greater in thickness than the element substrate 10. For example, the read-out circuit substrate 20 is preferably twice or more, more preferably five times or more, or still more preferably ten times or more in thickness than the element substrate 10. Otherwise, the thickness of the read-out circuit substrate 20 is, for example, 100 µm or greater, 150 µm or greater, or 200 µm or greater. The read-out circuit substrate 20 having a greater thickness, as described above, secures mechanical strength of the light receiving element 1. It is to be noted that the read-out circuit substrate 20 may include only the semiconductor substrate 21 in which the circuits are formed. Alternatively, the read-out circuit substrate 20 may further include another substrate such as a support substrate, in addition to the semiconductor substrate 21 in which the circuits are formed.

1-2. Manufacturing Method of Light Receiving Element

The light receiving element 1 may be manufactured through steps described below. FIGS. 6A to 16K illustrate, in sequential order, the manufacturing steps of the light receiving element 1.

As illustrated in FIG. 6A, for example, the semiconductor layer 10S is first epitaxially grown on a growth substrate 31 including InP. The thickness of the growth substrate 31 is, for example, several hundred µm. The thickness of the semiconductor layer 10S is, for example, several µm. After that, the adhesion layer B is formed on the semiconductor layer 10S, as illustrated in FIG. 6B. The diameter of the growth substrate 31 is, for example, 6 inches or smaller. To form the semiconductor layer 10S, for example, n-type InP for forming the first contact layer 12, i-type InGaAs for forming the photoelectric conversion layer 13, and n-type InP for forming the second contact layer 14 are epitaxially grown in this order. For example, the semiconductor layer 10S may be formed after a buffer layer and a stopper layer are formed on the growth substrate 31.

Next, the growth substrate 31 on which the semiconductor layer 10S is formed is bonded to the temporary substrate 33 with the adhesion layer B interposed, as illustrated in FIG. 6C. The temporary substrate 33 includes, for example, an insulating layer 33IA and a substrate 33S. The insulating layer 33IA is disposed, for example, between the adhesion layer B and the substrate 33S. The temporary substrate 33 is greater in diameter than the growth substrate 31. The substrate 33S is a silicon (Si) substrate, for example. The temporary substrate 33 has a diameter in a range from 8 inches to 12 inches, for example. Bonding the growth substrate 31 having the small diameter to the temporary substrate 33 having the large diameter allows various kinds of apparatuses for a large-diameter substrates to be used to form the element substrate 10. For example, the read-out circuit substrate 20 may be bonded to the element substrate 10 through Cu—Cu bonding to make finer pixels P. The growth substrate 31 may be bonded to the temporary substrate 33 through plasma activation bonding, normal temperature bonding, or bonding using an adhesive (adhesive bonding), for example. As described above, the semiconductor layer 10S in the form of a wafer, for example, is bonded to the temporary substrate 33. The thickness of the temporary substrate 33 is, for example, several hundred µm.

FIGS. 7 and 8 illustrate planar configuration examples of the temporary substrate 33 and the semiconductor layer 10S or the growth substrate 31. As illustrated in FIG. 7, the semiconductor layer 10S in the form of the wafer and smaller in size than the temporary substrate 33 may be bonded to the temporary substrate 33 in the form of a wafer. Alternatively, as illustrated in FIG. 8, a plurality of semiconductor layers 10S in the form of chips may be bonded to the temporary substrate 33 in the form of the wafer. In this state, the plurality of chips is separated away from each other.

Alternatively, as illustrated in FIGS. 9A and 9B, the semiconductor layer 10S in the form of the wafer and the temporary substrate 33 in the form of the wafer, which are identical in size to each other may be bonded to each other. FIG. 9A illustrates a planar configuration of the temporary substrate 33 and the semiconductor layer 10S or the growth substrate 31. FIG. 9B illustrates a cross-sectional configuration taken along a line II-II' in FIG. 9A.

After the growth substrate 31 on which the semiconductor layer 10S is formed is bonded to the temporary substrate 33, the growth substrate 31 is removed, as illustrated in FIG. 10A. The growth substrate 31 may be removed through mechanical grinding, chemical mechanical polishing (CMP), wet-etching, or dry-etching, for example. The growth substrate 31 may partially remain after the removal. The semiconductor layer 10S may be partially etched.

Next, as illustrated in FIG. 10B, for example, the semiconductor layer 10S is etched into a predetermined size in accordance with a mark on the temporary substrate 33. The semiconductor layer 10S is therefore formed into a plurality of chips.

FIG. 11A illustrates a planar configuration example of the semiconductor layer 10S before being shaped. FIG. 11B illustrates a planar configuration example of the semiconductor layer 10S after the shaping of the semiconductor layer 10S illustrated in FIG. 11A. FIG. 12A illustrates another planar configuration example of the semiconductor layer 10S before being shaped. FIG. 12B illustrates another planar configuration example of the semiconductor layer 10S after the shaping of the semiconductor layer 10S illustrated in FIG. 12A. As described above, the semiconductor layer 10S in the form of the wafer is shaped into a plurality of chips. The semiconductor layer 10S is smaller in size than the temporary substrate 33, as illustrated in FIG. 11A. Alternatively, the semiconductor layer 10S is identical in size to the temporary substrate 33, as illustrated in FIG. 12A.

Alternatively, as illustrated in FIGS. 13A and 13B, the semiconductor layer 10S may be shaped into further smaller chips.

While the semiconductor layer 10S is being etched, the adhesion layer B is also being etched together with the semiconductor layer 10S, for example. The adhesion layer B may be etched into an area greater than the semiconductor layer 10S. The adhesion layer B may extend around the semiconductor layer 10S, as illustrated in FIG. 10B.

Alternatively, as illustrated in FIG. 14, the adhesion layer B may be etched into an area smaller than each chip of the semiconductor layer 10S, creating a void between each chip of the semiconductor layer 10S and the temporary substrate 33. Still alternatively, the adhesion layer B may be etched into an identical size to the semiconductor layer 10S.

As illustrated in FIG. 15, the adhesion layer B may not be etched while the semiconductor layer 10S is being etched.

The subsequent drawings to FIG. 16E illustrate a single chip of the semiconductor layer 10S, among the plurality of chips of the semiconductor layer 10S. FIG. 16F and the later drawings illustrate, similar to FIGS. 14 and 15, for example, two chips of the semiconductor layer 10S, among the plurality of chips of the semiconductor layer 10S.

After the semiconductor layer 10S is shaped, the diffusion regions 12A are formed in the respective pixels P in the semiconductor layer 10S, as illustrated in FIG. 16A. Element isolation thus takes place. To form the diffusion regions 12A, the insulating film 17A is used as a hard mask, for example. Specifically, the insulating film 17A is formed to cover an upper surface, i.e., an opposite surface to a bonding face with the temporary substrate 33, and the side surfaces of the semiconductor layer 10S, and thereafter the openings 17H are formed through etching on the insulating film 17A covering the upper surface of the semiconductor layer 10S. After that, vapor-phase diffusion of a p-type impurity is performed using the insulating film 17A as the hard mask to form the diffusion regions 12A in selective regions. The diffusion is performed substantially isotropically to a depth of, for example, several hundred nm. The diffusion regions 12A may be formed through solid-phase diffusion or ion implantation using a resist mask, for example. In the present embodiment, the diffusion regions 12A are formed in the semiconductor layer 10S provided on the temporary substrate 33 having the large diameter. This makes it possible to make the pixels P finer.

After the diffusion regions 12A are provided in the semiconductor layer 10S, the metal film 11A, which may be a multi-layered film including titanium (Ti) and tungsten (W), is formed on the semiconductor layer 10S, as illustrated in FIG. 16B. The metal film 11A is to be formed into the first electrodes 11. The metal film 11A is formed through, for example, a CVD method, a PVD method, an ALD method, or an evaporation method. Next, as illustrated in FIG. 16C, the metal film 11A is patterned into the first electrodes 11 through photolithography and etching, for example. At this time, as illustrated in FIG. 16C, the metal film 11A at least partially remains on the side surfaces of the semiconductor layer 10S. Specifically, the metal film 11A at least partially remains on the insulating film 17A covering the side surfaces of the semiconductor layer 10S. This improves passivation properties of the side surfaces of the semiconductor layer 10S.

After the first electrodes 11 are formed, the insulating film 17B is formed on an entire surface of the temporary substrate 33. The buried layer 18 is then formed, as illustrated in FIG. 16D. For example, an insulating material is formed into a film to bury the semiconductor layer 10S wholly in the temporary substrate 33. The film is then planarized through chemical mechanical polishing (CMP) to form the buried layer 18. At this time, the insulating film 17B serves as a stopper while the film undergoes planarizing, making it possible to prevent excessive polishing. The insulating film 17B also serves as another stopper during via-processing for purposes of coupling the contact electrodes 19E to the respective first electrodes 11. The buried layer 18 is therefore formed to cover the peripheral region R2 around the semiconductor layer 10S and the upper surface (the surface most distal from the temporary substrate 33) of the semiconductor layer 10S. The buried layer 18 fills level differences between the semiconductor layer 10S and the temporary substrate 33, suppressing inconveniences from occurring in the manufacturing steps due to the level differences between the semiconductor layer 10S and the temporary substrate 33.

After the buried layer 18 is formed, the wiring layer 10W is formed to face the semiconductor layer 10S across the buried layer 18, as illustrated in FIG. 16E. For example, after the interlayer insulating film 19A and the interlayer insulating film 19B are formed in this order on the buried layer 18, openings 19H1 and 19H2 extending through the buried layer 18 and the insulating film 17B are formed in regions, facing the expanded portions 11Y of the first electrodes 11, on the interlayer insulating films 19A and 19B. After a copper (Cu) film is formed through an evaporation method, a PVD method, or a plating method, for example, in the openings 19H1 and 19H2 of the interlayer insulating films 19A and 19B, a CMP method, for example, is used to polish a surface of the copper film to form the contact electrodes 19E. The dummy electrodes 19ED are formed in the peripheral region R2 simultaneously in the forming step of the contact electrodes 19E, for example. In the present embodiment, the wiring layer 10W is formed on the temporary substrate 33 having the large diameter. This makes it possible to use various kinds of apparatuses for substrates each having a large diameter.

After the wiring layer 10W is formed, the read-out circuit substrate 20 is bonded to the temporary substrate 33 with the wiring layer 10W interposed, as illustrated in FIG. 16F. At this time, the wiring layer 20W is formed beforehand in the read-out circuit substrate 20. The wiring layer 20W in the read-out circuit substrate 20 includes the contact electrodes 22E and the dummy electrodes 22ED. To bond the read-out circuit substrate 20 to the temporary substrate 33, the contact electrodes 22E and the dummy electrodes 22ED in the wiring layer 20W and the contact electrodes 19E and the dummy electrodes 19ED in the wiring layer 10W are bonded to each other through Cu—Cu bonding, for example. More specifically, the bonding face S2 where the contact electrodes 19E and the contact electrodes 22E are respectively bonded to each other is formed in the element region R1.

The bonding face S2 where the dummy electrodes 19ED and the dummy electrodes 22ED are bonded to each other is formed in the peripheral region R2. In the present embodiment, the peripheral region R2 on the element substrate 10 is also bonded to the read-out circuit substrate 20. It is to be noted that FIG. 1, FIG. 16F, and other drawings illustrate the example where the contact electrodes 19E face the respective contact electrodes 22E and are bonded to the respective contact electrodes 22E through Cu—CU bonding, and the dummy electrodes 19ED face the respective dummy electrodes 22ED and are bonded to the respective dummy electrodes 22ED through Cu—Cu bonding. However, these electrodes may be bonded in a partially shifted manner as long as the bonding therebetween is secured.

After the read-out circuit substrate 20 is bonded to the temporary substrate 33, the substrate 33S is removed, as illustrated in FIG. 16G. The substrate 33S may be removed through mechanical grinding, wet-etching, or dry-etching, for example.

After the substrate 33S is removed, the insulating layer 33IA and the adhesion layer B, for example, are also removed to allow the surface of the semiconductor layer 10S to be exposed, as illustrated in FIG. 16H. At this time, an unnecessary layer in the semiconductor layer 10S may be removed. The insulating layer 33IA or the insulating films 17A and 17B, excluding opening portions of the semiconductor layer 10S, may also be wholly or partially allowed to remain. The buried layer 18 may otherwise be partially scraped out.

Next, as illustrated in FIG. 16I, the second electrode 15 and the passivation film 16A are formed in this order on the exposed surface (the opposite surface to the surface on which the wiring layer 10W) of the semiconductor layer 10S after the temporary substrate 33 is removed. After that, the through holes H1, the electrically-conductive film 15B, and the passivation film 16B are formed in this order, as illustrated in FIG. 16J. The second electrode 15 and the read-out circuit substrate 20 are therefore electrically coupled to each other.

Finally, the through holes H2 extending through the element substrate 10 to the pad electrodes 22P in the read-out circuit substrate 20 are formed, as illustrated in FIG. 16K. The light receiving element 1 illustrated in FIG. 1 is therefore completed.

1-3. Operation of Light Receiving Element

In the light receiving element 1, when light at a wavelength within a region from the visible region to the infrared region, for example, is incident on the photoelectric conversion layer 13 via the passivation films 16A and 16B, the second electrode 15, and the second contact layer 14, the photoelectric conversion layer 13 absorbs the light. This causes pairs of holes and electrons to be generated in the photoelectric conversion layer 13. That is, the light undergoes photoelectric conversion. As a predetermined voltage is applied to the first electrodes 11 at this time, for example, a potential gradient occurs in the photoelectric conversion layer 13. Ones (e.g., holes) of the generated electric charges move to the diffusion regions 12A to serve as signal electric charges, and are collected from the diffusion regions 12A to the first electrodes 11. The signal electric charges move, via the contact electrodes 19E and 22E, to the semiconductor substrate 21. The signal electric charges are then read from the respective pixels P.

1-4. Workings and Effects

In the light receiving element 1 according to the present embodiment, the expanded portions 11Y are formed along the insulating film 17A, around the coupling portions 11X of the first electrodes 11. That is, the expanded portions 11Y are formed in the openings 17H of the insulating film 17A. The coupling portions 11X are electrically coupled to the semiconductor layer 10S. The vias 19V are coupled to the respective expanded portions 11Y. The configuration described above therefore improves ease of contact between the first electrodes 11 and the vias 19V. Reasons of the improvement will now be described herein.

As described above, image sensors or infrared sensors having sensitivity within an infrared region have been commercially available. For example, a semiconductor element has been known that includes an element substrate and a circuit substrate bonded to each other through Cu—Cu bonding. The element substrate is a laminate of a compound semiconductor layer and a wiring layer.

In the semiconductor element described above, through wiring lines/through silicon via are coupled through opening portions of an insulating film. The through wiring lines are used to electrically couple electrodes and the circuit substrate. In the insulating film, diffusion regions on the compound semiconductor layer and the electrodes are in contact with each other. In the semiconductor element having such a structure as described above, the opening portions, as well as the coupling between the electrodes and the through wiring lines, can affect the compound semiconductor layer and lower electrical characteristics. Level differences formed at or around the electrodes above the opening portions can lead to contact failures between the electrodes and the through wiring lines.

To suppress such a contact failure from occurring, in the present embodiment, the expanded portions 11Y extending from the respective coupling portions 11X are provided along the insulating film 17A, around the coupling portions 11X of the first electrodes 11. The coupling portions 11X are in contact with the semiconductor layer 10S. The vias 19V are coupled to the respective expanded portions 11Y. The vias 19V are also coupled to the respective contact electrodes 19E. The configuration described above therefore makes it possible to improve ease of contact between the first electrodes 11 and the vias 19V.

In the light receiving element 1 according to the present embodiment, as described above, the vias 19V are coupled to the respective expanded portions 11Y of the first electrodes 11. The vias 19V are also coupled to the respective contact electrodes 19E. The expanded portions 11Y are provided along the insulating film 17A. The present embodiment thus improves ease of contact between the first electrodes 11 and the vias 19V. It is also possible to reduce the area of the openings 17H through which the first electrodes 11 and the semiconductor layer 10S are electrically coupled to each other. A dark current is therefore suppressed from occurring. That is, it is possible to improve electrical characteristics.

Furthermore, the expanded portions 11Y are asymmetrically formed to allow the vias 19V to be coupled to wider portions extending on the insulating film 17A. This allows the vias 19V to have an increased diameter. It is thus possible to reduce contact resistance between the first electrodes 11 and the contact electrodes 19E. It is still possible to further improve electrical characteristics.

Some modification examples, i.e., modification examples 1 to 3, of the present embodiment described above will now be described. Note that the like elements are denoted with the same reference numerals, and any redundant description thereof is not described in detail.

2. MODIFICATION EXAMPLES

2-1. Modification Example 1

In the embodiment described above, the two insulating films 17A and 17B cover the counter surface that faces the wiring layer 10W and the end faces of the semiconductor layer 10S. However, only the insulating film 17A may cover the counter surface that faces the wiring layer 1 OW and the end faces of the semiconductor layer 10S. FIGS. 17A and 17B illustrate, in sequential order, manufacturing steps of the light receiving element 1, according to a modification example 1 to the embodiment described above.

As illustrated in FIG. 17A, the insulating film 17A is first formed to cover the upper surface and the side surfaces of the semiconductor layer 10S as in the embodiment described above. Thereafter, the openings 17H are formed on the insulating film 17A covering the upper surface of the semiconductor layer 10S through etching. Next, vapor-phase diffusion of a p-type impurity is performed using the insulating film 17A as a hard mask to form the diffusion regions 12A. After the diffusion regions 12A are formed, the metal film 11A is formed on the semiconductor layer 10S, as in the embodiment described above. The metal film 11A is to be formed into the first electrodes 11. The first electrodes 11 are then formed through photolithography and etching, for example. At this time, the metal film 11A at least partially remains on the insulating film 17A covering the side surfaces of the semiconductor layer 10S. After that, the buried layer 18 is formed wholly on the temporary substrate 33, as illustrated in FIG. 17B.

2-2. Modification Example 2

FIGS. 18A to 18F illustrate, in sequential order, manufacturing steps of the light receiving element 1, according to a modification example 2 to the embodiment described above.

As illustrated in FIG. 18A, the semiconductor layer 10S is first formed in the form of a plurality of chips on the temporary substrate 33, as in the embodiment described above. Next, the insulating film 17A is formed to cover the upper surface (the opposite surface to the bonding face with the temporary substrate 33) and the side surfaces of the semiconductor layer 10S, as illustrated in FIG. 18B. Next, the insulating film 18A constituting the buried layer 18 is formed on an entire surface of the temporary substrate 33, as illustrated in FIG. 18C. After that, the insulating film 18A and the insulating film 17A are allowed to undergo CMP to expose the surface of the semiconductor layer 10S. Level differences between the semiconductor layer 10S and the temporary substrate 33 are thus filled.

Next, as illustrated in FIG. 18D, the insulating film 18B is formed on entire surfaces of the semiconductor layer 10S and the interlayer insulating film 18A, and openings 18H are formed through etching. After that, vapor-phase diffusion of a p-type impurity is performed in the first contact layer 12 in the semiconductor layer 10S using the insulating film 18B as a hard mask, to form the diffusion regions 12A in selective regions.

After the diffusion regions 12A are formed on the semiconductor layer 10S, as illustrated in FIG. 18E, a metal film is formed on the insulating film 18B to fill the openings 1811. The metal film is, for example, a multi-layered film including titanium (Ti) and tungsten (W). The metal film is patterned into the first electrodes 11 through photolithography and etching, for example.

After the first electrodes 11 are formed, as illustrated in FIG. 18F, the insulating film 17B is formed to cover the insulating film 18B and the first electrodes 11. After that, an insulating film constituting the buried layer 18, together with the insulating films 18A and 18B, is formed on the insulating film 17B, as in the embodiment described above, and the surface of the insulating film is planarized through CMP, for example. Thereafter, forming the wiring layer 10W, bonding the read-out circuit substrate 20, and removing the temporary substrate 33 are performed in sequence, for example. The light receiving element 1 may be manufactured through such steps as described above.

It is to be noted that the insulating film 17B covering the insulating film 18B and the first electrodes 11 may be omitted, as in the modification example 1 described above. That is, an insulating film constituting the buried layer 18, together with the insulating films 18A and 18B, may be directly formed on the insulating film 18B and the first electrodes 11.

2-3. Modification Example 3

FIG. 19 illustrates a cross-sectional configuration of a light receiving element 1A according to a modification example 3 of the embodiment described above. The light receiving element 1A includes a color filter layer 41 and on-chip lenses (collecting lenses) 42 on the light incident face S1 (the opposite surface to the counter surface facing the read-out circuit substrate 20) of the element substrate 10. Except this configuration, the light receiving element 1A has a similar configuration and presents similar effects, to the configuration and the effects of the light receiving element 1. The color filter layer 41 may include at least one of an RGB (Red, Green and Blue) color filter, an IR color filter, a CMYG (Cyan, Magenta, Yellow and Green) color filter, a clear filter that transmit wide wavelength and other suitable color filter according to an embodiment. In another embodiment, the light receiving element 1A includes on-chip lenses (collecting lenses) 42 on the light incident face S1 without a color filter layer interposed inbetween.

In the light receiving element 1A, for example, the color filter layer 41 and the on-chip lenses 42 corresponding to RGB are provided in this order on the passivation films 16A and 16B of the element substrate 10 with a planarizing film 16C interposed. The color filter layer 41 may include an infrared (IR) filter. Providing the color filter layer 41 makes it possible to acquire light-receiving data of light received at corresponding wavelengths in the respective pixels P.

The on-chip lenses 42 cause light incident onto the light receiving element 1A to converge onto the photoelectric conversion layer 13. The on-chip lenses 42 include, for example, an organic material or silicon oxide ($SiO_2$). In the light receiving element 1A, the buried layer 18 is provided in the peripheral region R2. Level differences become smaller or otherwise no level difference is created between the element region R1 and the peripheral region R2 on the element substrate 10, forming the planar light incident face S1. A photolithography step, for example, is therefore used, making it possible to highly accurately form the on-chip lenses 42. For example, the color filter layer 41 and the on-chip lenses 42 are terminated in the element region R1. The planarizing film 16C disposed between the passivation films 16A and 16B and the color filter layer 41 is provided, for example, from the element region R1 to the peripheral region R2. The planarizing film 16C is terminated in the peripheral region R2. The color filter layer 41, the on-chip lenses 42, and the planarizing film 16C may be terminated at any positions in the element region R1 or the peripheral region R2.

In the modification example, the color filter layer 41 and the on-chip lenses 42 may be provided on the light incident face S1 of the element substrate 10. Even in the modification example, it is possible to achieve effects equivalent to the effects of the embodiments described above. It is also possible to read pixel signals on a color basis by setting the second contact layer 14 to have a film thickness in the range from 5 nm to 300 nm, for example, in the configuration according to the modification example. Furthermore, it is possible to easily form, at high accuracy, the on-chip lenses 42 on the light incident face S1 planarized with the buried layer 18.

3. APPLICATION EXAMPLES

Application Example 1

FIG. 20 illustrates an operational configuration of an imaging device 2 using the device structure of the light receiving element 1 illustrated in the embodiment described above. The imaging device 2 is an infrared light image sensor, for example. The imaging device 2 has the element region R1 provided on the light receiving element 1, and a circuit portion 130 that drives the element region R1, for example. The circuit portion 130 includes, for example, a row scanner 131, a horizontal selector 133, a column scanner 134, and a system controller 132.

The element region R1 is disposed in a two-dimensional matrix, for example. In the element region R1, the plurality of pixels P constituting the light receiving element 1 is provided. A pixel driving line Lread is provided on each pixel row of the pixels P, for example. The pixel driving lines Lread are row selection lines or reset control lines, for example. Additionally, a vertical signal line Lsig is provided on each pixel column of the pixels P. The pixel driving lines Lread transmit drive signals for reading signals from the pixels P. One end of each pixel driving line Lread is coupled to a corresponding output end of the row scanner 131.

The row scanner 131 includes a shift register and an address decoder, for example. The row scanner 131 serves as a pixel driver that drives the pixels P in the element region R1 on a row basis, for example. Signals outputted from the pixels P on the pixel row selectively scanned by the row scanner 131 are supplied, via the corresponding vertical signal line Lsig, to the horizontal selector 133. The horizontal selector 133 includes, for example, an amplifier and a horizontal selection switch provided on each vertical signal line Lsig.

The column scanner 134 includes a shift register and an address decoder, for example. The column scanner 134 scans and sequentially drives the horizontal selection switches of the horizontal selector 133. As the column scanner 134 selects and scans the switches, signals transmitted from the pixels via the vertical signal lines Lsig are sequentially outputted to horizontal signal lines 135. The signals then enter, via the horizontal signal lines 135, a non-illustrated signal processor, for example.

In the imaging device 2, as illustrated in FIG. 21, for example, the element substrate 10 having the element region R1, and the read-out circuit substrate 20 including the circuit portion 130 are laminated with each other. However, the present disclosure is not limited to such a configuration as described above. The circuit portion 130 and the element region R1 may be formed on a single substrate. The circuit portion 130 may otherwise be disposed on an external control integrated circuit (IC). Alternatively, the circuit portion 130 may be formed on another substrate coupled with cables, for example.

The system controller 132 receives external data, such as clock data or data instructing an operation mode, for example. The system controller 132 also outputs data including, for example, internal information on the imaging device 2. The system controller 132 further includes a timing generator that generates various kinds of timing signals. On the basis of the various kinds of timing signals generated in the timing generator, the system controller 132 drives and controls the row scanner 131, the horizontal selector 133, and the column scanner 134, for example.

Application Example 2

It is possible to apply the imaging device 2 described above to various types of electronic apparatuses, including, for example, a camera that captures images within the infrared region. FIG. 22 illustrates, as one example, an outline configuration of a camera representing an electronic apparatus 3. The electronic apparatus 3 is a camera that is able to capture still images or videos, for example. The electronic apparatus 3 includes the imaging device 2, an optical system or optical lens 210, a shutter 211, a driver 213, and a signal processor 212. The driver 213 drives the imaging device 2 and the shutter 211.

The optical system 210 guides image light or incident light from an object to the imaging device 2. The optical system 210 may include a plurality of optical lenses. The shutter 211 controls a period during which light is irradiated onto the imaging device 2. The shutter 211 also controls a light shielding period. The driver 213 controls a transfer operation to the device 2 and a shutter operation of the shutter 211. The signal processor 212 performs various kinds of signal processing on signals outputted from the imaging device 2. An image signal Dout having undergone signal processing is stored in a storage medium such as memory, or is outputted to a monitor, for example.

Furthermore, it is also possible to apply the light receiving element 1 illustrated in the present embodiment and other examples to electronic apparatuses described below.

4. APPLIED EXAMPLES

Applied Examples to Endoscopic Surgery System

The technology according to the present disclosure (the present technology) is applicable to various products. For example, the technology according to the present disclosure may be applied to an endoscopic surgery system.

FIG. 23 is a view depicting an example of a schematic configuration of an endoscopic surgery system to which the technology according to an embodiment of the present disclosure (present technology) can be applied.

In FIG. 23, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 24 is a block diagram depicting an example of a functional configuration of the camera head 11102 and the CCU 11201 depicted in FIG. 23.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure is applicable has been described above. The technology according to the present disclosure is applied to, for example, the image pickup unit 11402 in the configuration described above. Applying the technology according to the present disclosure to the image pickup unit 11402 improves detection accuracy.

It is to be noted that the endoscopic surgery system is described as an example in the description above, the technology according to the present disclosure may be applied to, for example, microscopic surgery system.

Applied Examples to Mobile Body

The technology according to the present disclosure (present technology) is applicable to various products. For example, the technology according to the present disclosure may be achieved in the form of an apparatus to be mounted on a mobile body of any kind. Non-limiting examples of the mobile body may include an automobile, an electric vehicle, a hybrid electric vehicle, a motorcycle, a bicycle, any personal mobility device, an airplane, an unmanned aerial vehicle (drone), a vessel, and a robot.

FIG. 25 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 25, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 25, an audio speaker 12061, a display section 12062, and an instrument panel 12063 are illustrated as the output device. The display section 12062 may, for example, include at least one of an on-board display and a head-up display.

FIG. 26 is a diagram depicting an example of the installation position of the imaging section 12031.

In FIG. 26, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 26 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the hack door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure has been described above. The technology according to the present disclosure may be applied to, for example, the imaging section 12031 in the configuration described above. Applying the technology according to the present disclosure to the imaging section 12031 allows a pickup image to be more easily viewable, helping reduce fatigue of a driver.

Although the present disclosure has been described with reference to the present embodiment, the modification examples 1 to 3, the application examples, the applied examples, and other examples, the contents of the present disclosure are not limited thereto, but may be modified in a wide variety of ways. For example, the layer configuration of the light receiving element according to the present embodiment described above is merely an example, and may further include other layers. Additionally, the materials and the thicknesses of the layers merely illustrate examples, and are not limited to the values described above. In the embodiment described above, the semiconductor layer 10S includes the first contact layer 12, the photoelectric conversion layer 13, and the second contact layer 14. For example, the semiconductor layer 10S, however, may include at least the photoelectric conversion layer 13. For example, the first contact layer 12 and the second contact layer 14 may not be provided. Other layers may otherwise be included.

Furthermore, holes serve as signal electric charges in the embodiment described above, for purpose of convenience. However, electrons may serve as signal electric charges. For example, an n-type impurity may be included in the diffusion regions.

In addition, the light receiving element represents, in the embodiment described above, a specific but non-limiting example of a semiconductor element according to an embodiment of the present technology. However, another element than the light receiving element may represent a semiconductor element according to an embodiment of the present technology. For example, a luminescent element may represent a semiconductor element according to an embodiment of the present technology.

It should be appreciated that the effects described herein are mere examples. Effects of the present embodiment and other examples of the present disclosure are not limited to those described herein. The present disclosure may further include any effect other than those described herein.

Moreover, for example, the present disclosure may have the following configuration. According to the present technology having the configurations described below, the through wiring line is coupled to the expanded portion of the first electrode. The expanded portion is provided along the insulating layer, around the opening. Via the opening, the expanded portion is electrically coupled to the semiconductor layer. The configuration thus improves ease of contact between the first electrode and the through wiring line. It is thus possible to improve electrical characteristics.

The present disclosure may have the following configurations.

(1)

A semiconductor element, comprising:
- an element substrate including a laminate of a wiring layer and a semiconductor layer, the semiconductor layer including a compound semiconductor material;
- a read-out circuit substrate facing the semiconductor layer across the wiring layer, the read-out circuit substrate being electrically coupled, via the wiring layer, to the semiconductor layer;
- an insulating film covering at least one surface of the semiconductor layer, the one surface facing the wiring layer, the insulating film having an opening in which the semiconductor layer is partially exposed;
- a first electrode having a coupling portion and an expanded portion, the coupling portion being electrically coupled to the semiconductor layer within the opening, the expanded portion extending on the insulating film; and
- a through wiring line having one end and another end, the one end being coupled to the expanded portion of the first electrode, the other end being electrically coupled to a wiring line in the wiring layer.

(2)

The semiconductor element according to (1), in which
- the expanded portion has, in plan view, a substantially planar face asymmetrically extending on the insulating film around the opening, the substantially planar face of the expanded portion having a first region and a second region, the first region having a wider area than the second region, and
- the through wiring line is coupled to the first region of the substantially planar face of the expanded portion.

(3)

The semiconductor element according to (1) or (2), in which
- the wiring layer includes one or more first contact electrodes exposed to a counter surface facing the read-out circuit substrate, and
- the through wiring line is electrically coupled to the one or more first contact electrodes.

(4)

The semiconductor element according to (3), in which
- the read-out circuit substrate includes one or more second contact electrodes exposed to a counter surface facing the element substrate, and
- the element substrate and the read-out circuit substrate are bonded to each other via the one or more first contact electrodes and the one or more second contact electrodes.

(5)

The semiconductor element according to any one of (1) to (4), in which the insulating film extends from the one surface of the semiconductor layer to side surfaces of the semiconductor layer.

(6)

The semiconductor element according to (5), in which a metal film is provided to face at least part of the side surfaces of the semiconductor layer across the insulating film.

(7)

The semiconductor element according to any one of (1) to (6), in which the element substrate has an element region and a peripheral region, the wiring layer and the semiconductor layer being laminated with each other in the element region, the peripheral region lying outside of the element region and having a through hole extending to the read-out circuit substrate.

(8)

The semiconductor element according to (7), in which the element substrate further includes a second electrode facing the first electrode across the semiconductor layer, the second electrode being electrically coupled, via the through hole, to the read-out circuit substrate.

(9)

The semiconductor element according to any one of (1) to (8), in which the compound semiconductor material absorbs light at a wavelength within an infrared region.

(10)

The semiconductor element according to any one of (1) to (9), in which the semiconductor layer includes a group III-V semiconductor material.

(11)

The semiconductor element according to any one of (1) to (10), in which the compound semiconductor material is any one of InGaAs, InAsSb, InAs, InSb, and HgCdTe.

(12)

An electronic apparatus, comprising a semiconductor element including:
- an element substrate including a laminate of a wiring layer and a semiconductor layer, the semiconductor layer including a compound semiconductor material;
- a read-out circuit substrate facing the semiconductor layer across the wiring layer, the read-out circuit substrate being electrically coupled, via the wiring layer, to the semiconductor layer;
- an insulating film covering at least one surface of the semiconductor layer, the one surface facing the wiring layer, the insulating film having an opening in which the semiconductor layer is partially exposed;
- a first electrode having a coupling portion and an expanded portion, the coupling portion being electrically coupled to the semiconductor layer within the opening, the expanded portion extending on the insulating film; and
- a through wiring line having one end and another end, the one end being coupled to the expanded portion of the first electrode, the other end being electrically coupled to a wiring line in the wiring layer.

(13)

A light-detecting device, comprising:
- a first substrate including a first electrode, a semiconductor layer including a compound semiconductor material, a first insulating film, and a via;
- a second substrate that faces the first substrate and is electrically connected to the semiconductor layer through the via;
- wherein the first electrode includes a first portion and the second portion, and wherein the first portion of the first electrode is in contact with the semiconductor layer, and the second portion is in contact with both the first insulating film and the via.

(14)

The light-detecting device according to (13), wherein the first electrode has a step shape.

(15)

The light-detecting device according to (13) or (14), wherein the second portion of the first electrode is overlapped with the via in a plan view.

(16)

The light-detecting device according to any one of (13) to (15), wherein the first portion of the first electrode is not overlapped with the via in the plan view.

(17)

The light-detecting device according to any one of (13) to (16), wherein the semiconductor layer includes a photoelectric conversion layer, and the photoelectric conversion layer includes the compound semiconductor material.

(18)

The light-detecting device according to any one of (13) to (17), wherein the semiconductor layer includes a diffusion region, and the first portion is in contact with the diffusion region.

(19)

The light-detecting device according to any one of (13) to (18), wherein the diffusion region is configured to read electric charges generated from the photoelectric conversion layer.

(20)

The light-detecting device according to any one of (13) to (19), wherein the photoelectric conversion layer is configured to absorb light from a visible region to a short infrared region.

(21)

The light-detecting device according to any one of (13) to (20), wherein the compound semiconductor material includes at least one of indium gallium arsenide, indium arsenic antimony, indium arsenide, indium antimony, and mercury cadmium telluride.

(22)

The light-detecting device according to any one of (13) to (21), further comprising a second electrode facing the first electrode, wherein the semiconductor layer is provided between the first and second electrodes.

(23)

The light-detecting device according to any one of (13) to (22), further comprising a second insulating film, wherein the second portion of the first electrode is sandwiched between the first and second insulating films.

(24)

The light-detecting device according to any one of (13) to (23), further comprising on-chip lenses on a light incident surface of the first substrate.

(25)

The light-detecting device according to any one of (13) to (24), wherein the first substrate includes a third electrode and the second substrate includes a fourth electrode, and wherein the first and second substrates are electrically connected through the third and fourth electrodes.

(26)

The light-detecting device according to any one of (13) to (25), wherein the third and fourth electrodes each include a copper pad.

(27)

The light-detecting device according to any one of (13) to (26), wherein the third electrode is overlapped with the first electrode in a plan view, and the third electrode is in contact with the via.

(28)

The light-detecting device according to any one of (13) to (27), wherein the first substrate and the second substrate are stacked with each other, and the third electrode is in contact with the fourth electrode.

(29)

The light-detecting device according to any one of (13) to (28), wherein the via includes at least one of a through silicon via and a through wiring line.

(30)

The light-detecting device according to any one of (13) to (29), wherein the second substrate includes a read-out circuit configured to read out electric charge signal from the first substrate.

(31)

A method of manufacturing a light-detecting device, comprising:
  forming a first substrate including a first electrode, a semiconductor layer including a compound semiconductor material, a first insulating film, and a via;
  forming a second substrate that faces the first substrate and is electrically connected to the semiconductor layer through the via;
  wherein the first electrode includes a first portion and the second portion, and
  wherein the first portion is in contact with the semiconductor layer, and the second portion is in contact with both the first insulating film and the via.

(32)

An electronic apparatus that includes a light-detecting device, the light-detecting device comprising:
  a first substrate including a first electrode, a semiconductor layer including a compound semiconductor material, a first insulating film, and a via;
  a second substrate that faces the first substrate and is electrically connected to the semiconductor layer through the via;
  wherein the first electrode includes a first portion and the second portion, and
  wherein the first portion is in contact with the semiconductor layer, and the second portion is in contact with both the first insulating film and the via.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST 1 light receiving element
2 imaging device
3 electronic apparatus
10 element substrate
10S semiconductor layer
10W wiring layer
11 first electrode
11C concave portion
11X coupling portion
11Y expanded portion
12 first contact layer
12A diffusion region
13 photoelectric conversion layer 14 second contact layer
15 second electrode
16A, 16B passivation film
17A, 17B, 18A, 18B insulating films
17H, 18H, 19H1, 19H2 openings
18 buried layer
18V, 22V through electrodes
19A, 19B, 22A, 2B interlayer insulating films
19E, 22E contact electrodes
19ED, 22ED dummy electrodes
20 read-out circuit substrate
21 semiconductor substrate
22CB wiring line
22P pad electrode
31 growth substrate
32 insulating layer
33 temporary substrate
41 color filter layer
42 on-chip lens
51S silicon layer
B adhesion layer
H1, H2 through holes
P pixel
R1 element region
R2 peripheral region
S1 light incident face
S2 bonding face

The invention claimed is:

1. A light-detecting device, comprising:
a first substrate including a first electrode, a semiconductor layer including a compound semiconductor material, a first insulating film, and a via;
a second substrate that faces the first substrate and is electrically connected to the semiconductor layer through the via;
wherein the first electrode includes a first portion and a second portion, and
wherein the first portion of the first electrode is in contact with the semiconductor layer, and the second portion is in contact with both the first insulating film and the via,
wherein the second portion of the first electrode is overlapped with the via in a plan view, and
wherein the first portion of the first electrode is not overlapped with the via in the plan view.

2. The light-detecting device according to claim 1, wherein the first electrode has a step shape.

3. The light-detecting device according to claim 1, wherein the semiconductor layer includes a photoelectric conversion layer, and the photoelectric conversion layer includes the compound semiconductor material.

4. The light-detecting device according to claim 3, wherein the semiconductor layer includes a diffusion region, and the first portion is in contact with the diffusion region.

5. The light-detecting device according to claim 4, wherein the diffusion region is configured to read electric charges generated from the photoelectric conversion layer.

6. The light-detecting device according to claim 3, wherein the photoelectric conversion layer is configured to absorb light from a visible region to a short infrared region.

7. The light-detecting device according to claim 1, wherein the compound semiconductor material includes at least one of indium gallium arsenide, indium arsenic antimony, indium arsenide, indium antimony, and mercury cadmium telluride.

8. The light-detecting device according to claim 1, further comprising a second electrode facing the first electrode, wherein the semiconductor layer is provided between the first and second electrodes.

9. The light-detecting device according to claim 1, further comprising a second insulating film, wherein the second portion of the first electrode is sandwiched between the first and second insulating films.

10. The light-detecting device according to claim 1, further comprising on-chip lenses on a light incident surface of the first substrate.

11. The light-detecting device according to claim 1, wherein the first substrate includes a third electrode and the second substrate includes a fourth electrode, and wherein the first and second substrates are electrically connected through the third and fourth electrodes.

12. The light-detecting device according to claim 11, wherein the third and fourth electrodes each include a copper pad.

13. The light-detecting device according to claim 11, wherein the third electrode is overlapped with the first electrode in a plan view, and the third electrode is in contact with the via.

14. The light-detecting device according to claim 1, wherein the first substrate and the second substrate are stacked with each other, and the third electrode is in contact with the fourth electrode.

15. The light-detecting device according to claim 1, wherein the via includes at least one of a through silicon via and a through wiring line.

16. The light-detecting device according to claim 1, wherein the second substrate includes a read-out circuit configured to read out electric charge signal from the first substrate.

17. A method of manufacturing a light-detecting device, comprising:
forming a first substrate including a first electrode, a semiconductor layer including a compound semiconductor material, a first insulating film, and a via;
forming a second substrate that faces the first substrate and is electrically connected to the semiconductor layer through the via;
wherein the first electrode includes a first portion and a second portion, and
wherein the first portion is in contact with the semiconductor layer, and the second portion is in contact with both the first insulating film and the via,
wherein the second portion of the first electrode is overlapped with the via in a plan view, and
wherein the first portion of the first electrode is not overlapped with the via in the plan view.

18. An electronic apparatus that includes a light-detecting device, the light-detecting device comprising:
a first substrate including a first electrode, a semiconductor layer including a compound semiconductor material, a first insulating film, and a via;
a second substrate that faces the first substrate and is electrically connected to the semiconductor layer through the via;
wherein the first electrode includes a first portion and a second portion, and
wherein the first portion is in contact with the semiconductor layer, and the second portion is in contact with both the first insulating film and the via,
wherein the second portion of the first electrode is overlapped with the via in a plan view, and wherein the first portion of the first electrode is not overlapped with the via in the plan view.

* * * * *